United States Patent
Green et al.

(10) Patent No.: US 8,246,773 B2
(45) Date of Patent: *Aug. 21, 2012

(54) RFID LABEL TECHNIQUE

(75) Inventors: Alan Green, Greenwood, SC (US);
Dennis Rene Benoit, Simpsonville, SC (US)

(73) Assignee: Avery Dennison Corporation, Mentor, OH (US)

( * ) Notice: Subject to any disclaimer, the term of this patent is extended or adjusted under 35 U.S.C. 154(b) by 520 days.

This patent is subject to a terminal disclaimer.

(21) Appl. No.: 12/038,107

(22) Filed: Feb. 27, 2008

(65) Prior Publication Data

US 2008/0142154 A1 Jun. 19, 2008

Related U.S. Application Data

(60) Continuation of application No. 11/435,008, filed on May 16, 2006, now Pat. No. 7,368,032, which is a division of application No. 11/166,284, filed on Jun. 24, 2005, now Pat. No. 7,361,251, which is a continuation of application No. 10/323,490, filed on Dec. 18, 2002, now Pat. No. 6,951,596.

(60) Provisional application No. 60/350,606, filed on Jan. 18, 2002.

(51) Int. Cl.
*B32B 37/00* (2006.01)
*B32B 37/02* (2006.01)
*B32B 38/00* (2006.01)
*B32B 38/04* (2006.01)
*B32B 38/10* (2006.01)

(52) U.S. Cl. ........ 156/265; 156/250; 156/252; 156/253; 156/256; 156/263; 156/264

(58) Field of Classification Search .................. 156/250, 156/252, 263–265, 253, 256
See application file for complete search history.

(56) References Cited

U.S. PATENT DOCUMENTS

| | | | |
|---|---|---|---|
| 3,708,860 A | 1/1973 | Bolster et al. |
| 3,724,737 A | 4/1973 | Bodnar |
| 3,891,157 A | 6/1975 | Justus |
| 3,989,575 A | 11/1976 | Davies et al. |
| 4,242,663 A | 12/1980 | Slobodin |
| 4,480,742 A | 11/1984 | Muylle |
| 4,818,312 A | 4/1989 | Benge |

(Continued)

FOREIGN PATENT DOCUMENTS

DE 3203943 8/1983

(Continued)

OTHER PUBLICATIONS

Prosecution History from U.S. Appl. No. 10/323,490.

(Continued)

*Primary Examiner* — Mark A Osele
*Assistant Examiner* — Christopher C Caillouet
(74) *Attorney, Agent, or Firm* — Renner, Otto, Boisselle & Sklar, LLP

(57) ABSTRACT

An RFID webstock containing a relatively high pitch-density array of semiconductive chips is provided and joined to a web bearing relatively widely spaced antennas in a continuous process. The RFID webstock is separated or cut into individual chip sections, with the spacing of the chips being increased as the RFID webstock is die cut. The individual chips on the sections are then joined to corresponding antennas to form an RFID inlay stock. This process is conducive to high speed roll-to-roll production of RFID tag and label roll stock.

26 Claims, 10 Drawing Sheets

U.S. PATENT DOCUMENTS

| | | | |
|---|---|---|---|
| 4,819,488 A | 4/1989 | Morel | |
| 5,153,983 A | 10/1992 | Oyama | |
| 5,262,978 A | 11/1993 | Ito | |
| 5,264,061 A | 11/1993 | Juskey et al. | |
| 5,324,153 A | 6/1994 | Chess | |
| 5,409,788 A | 4/1995 | Weiss et al. | |
| 5,437,960 A | 8/1995 | Nagate et al. | |
| 5,441,796 A | 8/1995 | Steidinger et al. | |
| 5,519,381 A | 5/1996 | Marsh et al. | |
| 5,528,222 A | 6/1996 | Moskowitz et al. | |
| 5,537,105 A | 7/1996 | Marsh et al. | |
| 5,538,806 A | 7/1996 | Weiss et al. | |
| 5,545,291 A | 8/1996 | Smith et al. | |
| 5,550,547 A | 8/1996 | Chan et al. | |
| 5,557,280 A | 9/1996 | Marsh et al. | |
| 5,564,888 A | 10/1996 | Doan | |
| 5,566,441 A | 10/1996 | Marsh et al. | |
| 5,585,193 A | 12/1996 | Josephy et al. | |
| 5,604,049 A | 2/1997 | Weiss et al. | |
| 5,612,513 A | 3/1997 | Tuttle et al. | |
| 5,613,228 A | 3/1997 | Tuttle et al. | |
| 5,626,978 A | 5/1997 | Weiss et al. | |
| 5,645,932 A | 7/1997 | Uchibori | |
| 5,674,334 A | 10/1997 | Instance | |
| 5,682,143 A | 10/1997 | Brady et al. | |
| 5,707,475 A | 1/1998 | Steidinger et al. | |
| 5,728,599 A | 3/1998 | Rostoker et al. | |
| 5,758,575 A | 6/1998 | Isen et al. | |
| 5,766,406 A | 6/1998 | Bohn et al. | |
| 5,783,856 A | 7/1998 | Smith et al. | |
| 5,824,186 A | 10/1998 | Smith et al. | |
| 5,824,379 A | 10/1998 | Riley et al. | |
| 5,837,349 A | 11/1998 | Van Erden et al. | |
| 5,904,545 A | 5/1999 | Smith et al. | |
| 5,939,984 A | 8/1999 | Brady et al. | |
| 5,946,198 A | 8/1999 | Hoppe et al. | |
| 5,963,177 A | 10/1999 | Tuttle et al. | |
| 5,966,903 A * | 10/1999 | Dudderar et al. | ................ 53/397 |
| 5,972,152 A | 10/1999 | Lake et al. | |
| 5,972,156 A | 10/1999 | Brady et al. | |
| 5,982,284 A | 11/1999 | Baldwin et al. | |
| 5,982,628 A | 11/1999 | Houdeau et al. | |
| 6,018,299 A | 1/2000 | Eberhardt | |
| 6,019,865 A | 2/2000 | Palmer et al. | |
| 6,027,027 A | 2/2000 | Smithgall | |
| 6,040,773 A | 3/2000 | Vega et al. | |
| 6,043,746 A | 3/2000 | Sorrells | |
| 6,045,652 A | 4/2000 | Tuttle et al. | |
| 6,078,259 A | 6/2000 | Brady et al. | |
| 6,081,243 A | 6/2000 | Lake | |
| 6,082,660 A | 7/2000 | Meyer | |
| 6,091,332 A | 7/2000 | Eberhardt et al. | |
| 6,094,138 A | 7/2000 | Eberhardt et al. | |
| 6,104,291 A | 8/2000 | Beauvillier et al. | |
| 6,107,920 A | 8/2000 | Eberhardt et al. | |
| 6,107,921 A | 8/2000 | Eberhardt et al. | |
| 6,121,878 A | 9/2000 | Brady et al. | |
| 6,127,024 A | 10/2000 | Weiss et al. | |
| 6,130,613 A | 10/2000 | Eberhardt | |
| 6,139,664 A | 10/2000 | Melzer et al. | |
| 6,140,146 A | 10/2000 | Brady et al. | |
| 6,145,901 A | 11/2000 | Rich | |
| 6,147,605 A | 11/2000 | Vega et al. | |
| 6,147,662 A | 11/2000 | Grabau et al. | |
| 6,154,263 A | 11/2000 | Bailey | |
| 6,157,300 A | 12/2000 | Quaderer et al. | |
| 6,163,260 A | 12/2000 | Conwell et al. | |
| 6,164,137 A | 12/2000 | Hancock et al. | |
| 6,164,551 A | 12/2000 | Altwasser | |
| 6,165,386 A | 12/2000 | Endo et al. | |
| 6,172,608 B1 | 1/2001 | Cole | |
| 6,177,859 B1 | 1/2001 | Tuttle et al. | |
| 6,181,287 B1 | 1/2001 | Beigel | |
| 6,189,208 B1 | 2/2001 | Estes et al. | |
| 6,206,292 B1 | 3/2001 | Robertz et al. | |
| 6,207,001 B1 | 3/2001 | Steidinger et al. | |
| 6,215,401 B1 | 4/2001 | Brady et al. | |
| 6,218,942 B1 | 4/2001 | Vega et al. | |
| 6,236,223 B1 | 5/2001 | Brady et al. | |
| 6,236,316 B1 | 5/2001 | Eberhardt et al. | |
| 6,246,326 B1 | 6/2001 | Wiklof et al. | |
| 6,246,327 B1 | 6/2001 | Eberhardt | |
| 6,252,508 B1 | 6/2001 | Vega et al. | |
| 6,259,369 B1 | 7/2001 | Monico | |
| 6,259,408 B1 * | 7/2001 | Brady et al. | ........... 343/700 MS |
| 6,262,692 B1 | 7/2001 | Babb | |
| 6,265,977 B1 | 7/2001 | Vega et al. | |
| 6,271,793 B1 | 8/2001 | Brady et al. | |
| 6,271,801 B2 | 8/2001 | Tuttle et al. | |
| 6,274,508 B1 | 8/2001 | Jacobsen et al. | |
| 6,278,413 B1 | 8/2001 | Hugh et al. | |
| 6,280,544 B1 | 8/2001 | Fox et al. | |
| 6,281,036 B1 | 8/2001 | Niki et al. | |
| 6,281,795 B1 | 8/2001 | Smith et al. | |
| 6,282,407 B1 | 8/2001 | Vega et al. | |
| 6,320,556 B1 | 11/2001 | Cyman et al. | |
| 6,331,221 B1 | 12/2001 | Cobbley | |
| 6,342,843 B1 | 1/2002 | Hahn et al. | |
| 6,352,073 B1 * | 3/2002 | Kurosawa et al. | ............... 125/35 |
| 6,366,260 B1 | 4/2002 | Carrender | |
| 6,371,375 B1 | 4/2002 | Ackley et al. | |
| 6,384,727 B1 | 5/2002 | Diprizio et al. | |
| 6,392,545 B1 | 5/2002 | Lake et al. | |
| 6,406,935 B2 | 6/2002 | Kayanakis et al. | |
| 6,410,112 B1 | 6/2002 | Hatfield | |
| 6,412,086 B1 | 6/2002 | Friedman et al. | |
| 6,416,608 B1 | 7/2002 | Mynott et al. | |
| 6,424,263 B1 | 7/2002 | Lee et al. | |
| 6,451,154 B1 | 9/2002 | Grabau et al. | |
| 6,452,496 B1 | 9/2002 | Van Horn et al. | |
| 6,487,681 B1 | 11/2002 | Tuttle et al. | |
| 6,496,113 B2 | 12/2002 | Lee et al. | |
| 6,501,157 B1 | 12/2002 | Cobbley | |
| 6,514,790 B1 | 2/2003 | Plettner et al. | |
| 6,518,885 B1 | 2/2003 | Brady et al. | |
| 6,523,734 B1 | 2/2003 | Kawai et al. | |
| 6,549,176 B2 | 4/2003 | Hausladen | |
| 6,557,758 B1 | 5/2003 | Monico | |
| 6,606,247 B2 | 8/2003 | Credelle et al. | |
| 6,630,887 B2 | 10/2003 | Lake | |
| 6,630,910 B2 | 10/2003 | Forster et al. | |
| 6,645,327 B2 | 11/2003 | Austin et al. | |
| 6,646,554 B1 | 11/2003 | Goff et al. | |
| 6,662,430 B2 | 12/2003 | Brady et al. | |
| 6,665,193 B1 | 12/2003 | Chung et al. | |
| 6,696,952 B2 | 2/2004 | Zirbes | |
| 6,717,923 B1 | 4/2004 | Smith | |
| 6,720,865 B1 | 4/2004 | Forster et al. | |
| 6,739,047 B2 | 5/2004 | Hammond et al. | |
| 6,772,663 B2 | 8/2004 | Machamer | |
| 6,779,246 B2 | 8/2004 | Debraal | |
| 6,779,733 B2 | 8/2004 | Akita et al. | |
| 6,781,508 B2 | 8/2004 | Tuttle et al. | |
| 6,786,419 B2 | 9/2004 | Kayanakis | |
| 6,796,508 B2 | 9/2004 | Muller | |
| 6,798,121 B2 | 9/2004 | Nakatani et al. | |
| 6,809,045 B1 | 10/2004 | Alam et al. | |
| 6,816,380 B2 | 11/2004 | Credelle et al. | |
| 6,820,314 B2 | 11/2004 | Ferguson et al. | |
| 6,838,989 B1 | 1/2005 | Mays et al. | |
| 6,851,617 B2 | 2/2005 | Saint et al. | |
| 6,891,110 B1 | 5/2005 | Pennaz et al. | |
| 6,951,596 B2 | 10/2005 | Green et al. | |
| 6,972,394 B2 | 12/2005 | Brod et al. | |
| 7,402,460 B1 * | 7/2008 | Plettner | ........................ 438/108 |
| 2001/0030628 A1 | 10/2001 | Brady et al. | |
| 2002/0011677 A1 | 1/2002 | Yokoi et al. | |
| 2002/0067268 A1 | 6/2002 | Lee et al. | |
| 2002/0129488 A1 | 9/2002 | Lieberman | |
| 2002/0167405 A1 | 11/2002 | Shanks et al. | |
| 2002/0171591 A1 | 11/2002 | Beard | |
| 2002/0195194 A1 | 12/2002 | Grabau et al. | |
| 2002/0195195 A1 | 12/2002 | Grabau et al. | |
| 2003/0034127 A1 | 2/2003 | Segawa | |
| 2003/0036249 A1 | 2/2003 | Bauer et al. | |
| 2003/0062783 A1 | 4/2003 | Horng et al. | |
| 2003/0080919 A1 | 5/2003 | Forster et al. | |

| | | | | | | |
|---|---|---|---|---|---|---|
| 2003/0089444 A1 | 5/2003 | Melzer et al. | | JP | 200135989 | 2/2001 |
| 2003/0102541 A1 | 6/2003 | Gore et al. | | JP | 2001-257222 | 9/2001 |
| 2003/0117334 A1 | 6/2003 | Forster et al. | | JP | 20017511 | 12/2001 |
| 2003/0121986 A1 | 7/2003 | Stromberg et al. | | JP | 2002298104 | 10/2002 |
| 2003/0132893 A1 | 7/2003 | Forster et al. | | JP | 2002298107 | 10/2002 |
| 2003/0151028 A1 | 8/2003 | Lawrence et al. | | JP | 2003006594 | 1/2003 |
| 2003/0153269 A1 | 8/2003 | Smit et al. | | JP | 2003059337 | 2/2003 |
| 2003/0209697 A1 | 11/2003 | Orsbon et al. | | JP | 2003281936 | 3/2003 |
| 2004/0004294 A1 | 1/2004 | Stromberg et al. | | JP | 2003283120 | 10/2003 |
| 2004/0005754 A1 | 1/2004 | Stromberg | | JP | 2003283121 | 10/2003 |
| 2004/0032377 A1 | 2/2004 | Forster et al. | | JP | 2003288570 | 10/2003 |
| 2004/0037053 A1 | 2/2004 | Akita et al. | | JP | 2004038573 | 2/2004 |
| 2004/0040740 A1 | 3/2004 | Nakatani et al. | | JP | 2004180217 | 6/2004 |
| 2004/0041739 A1 | 3/2004 | Forster et al. | | JP | 2004-220304 | 8/2004 |
| 2004/0061655 A1 | 4/2004 | Forster et al. | | JP | 2004334432 | 11/2004 |
| 2004/0061994 A1 | 4/2004 | Kerr et al. | | WO | 9854681 | 12/1998 |
| 2004/0072385 A1 | 4/2004 | Bauer et al. | | WO | 9941721 | 8/1999 |
| 2004/0075616 A1 | 4/2004 | Endo et al. | | WO | 0014733 | 3/2000 |
| 2004/0089408 A1 | 5/2004 | Brod et al. | | WO | 0016285 | 3/2000 |
| 2004/0102870 A1 | 5/2004 | Andersen et al. | | WO | 0021031 | 4/2000 |
| 2004/0117985 A1 | 6/2004 | Chung et al. | | WO | 0030583 | 6/2000 |
| 2004/0125040 A1 * | 7/2004 | Ferguson et al. ............ 343/895 | | WO | 0154058 | 7/2001 |
| 2004/0151028 A1 | 8/2004 | Chih et al. | | WO | 0161646 | 8/2001 |
| 2004/0155328 A1 | 8/2004 | Kline | | WO | 0162517 | 8/2001 |
| 2004/0173781 A1 | 9/2004 | Lawrence et al. | | WO | 0195241 | 12/2001 |
| 2004/0175515 A1 | 9/2004 | Lawrence et al. | | WO | 0195252 | 12/2001 |
| 2004/0175548 A1 | 9/2004 | Lawrence et al. | | WO | 0237414 | 5/2002 |
| 2004/0175550 A1 | 9/2004 | Lawrence et al. | | WO | 0249093 | 6/2002 |
| 2004/0176032 A1 | 9/2004 | Kotola et al. | | WO | 02089051 | 7/2002 |
| 2004/0183182 A1 | 9/2004 | Swindlehurst et al. | | WO | 02082368 | 10/2002 |
| 2004/0188531 A1 | 9/2004 | Gengel et al. | | WO | 02093473 | 11/2002 |
| 2004/0192011 A1 | 9/2004 | Roesner | | WO | 02093625 | 11/2002 |
| 2004/0201112 A1 | 10/2004 | Divigalpitiya et al. | | WO | 02093637 | 11/2002 |
| 2004/0212544 A1 | 10/2004 | Pennaz et al. | | WO | 02095673 | 11/2002 |
| 2004/0215350 A1 | 10/2004 | Roesner | | WO | 02097723 | 12/2002 |
| 2004/0246099 A1 | 12/2004 | Tuttle | | WO | 03007232 | 1/2003 |
| 2005/0001725 A1 | 1/2005 | Brady et al. | | WO | 03105063 | 12/2003 |
| 2005/0007296 A1 | 1/2005 | Endo et al. | | WO | 03107266 | 12/2003 |
| 2005/0021172 A1 | 1/2005 | Winter et al. | | WO | 2004046762 | 6/2004 |
| 2005/0024291 A1 | 2/2005 | Aisenbrey | | WO | 2004-079646 | 9/2004 |
| 2005/0252605 A1 | 11/2005 | Green et al. | | WO | 2004084128 | 9/2004 |
| 2006/0213609 A1 | 9/2006 | Green et al. | | WO | 2004100098 | 11/2004 |
| | | | | WO | 2004100309 | 11/2004 |
| | | | | WO | 2005006248 | 1/2005 |

FOREIGN PATENT DOCUMENTS

| | | |
|---|---|---|
| DE | 19634473 | 8/1996 |
| DE | 19805031 | 2/1998 |
| DE | 19840226 | 9/1998 |
| DE | 19722327 | 12/1998 |
| DE | 10017431 | 10/2001 |
| DE | 10120269 | 7/2002 |
| EP | 0902475 | 9/1998 |
| EP | 0979790 | 7/1999 |
| EP | 0983579 | 3/2000 |
| EP | 1035503 | 9/2000 |
| EP | 1039542 | 9/2000 |
| EP | 1039543 | 9/2000 |
| EP | 1063737 | 12/2000 |
| EP | 1302974 | 10/2002 |
| EP | 1479040 | 2/2003 |
| EP | 1382010 | 1/2004 |
| EP | 1470528 | 10/2004 |
| FR | 2775533 | 2/1998 |
| FR | 2806029 | 9/2001 |
| GB | 2341166 | 6/1999 |
| JP | 08-096800 A | 4/1996 |
| JP | 11-314480 | 11/1999 |
| JP | 11-353448 | 12/1999 |
| JP | 2000-057287 | 2/2000 |
| JP | 2000311233 | 7/2000 |

OTHER PUBLICATIONS

Prosecution History from U.S. Appl. No. 11/166,284.
Prosecution History from U.S. Appl. No. 11/435,008.
Sanjay Sarma, Auto-ID Center, Published Nov. 1, 2001, pp. 1-19, "White Paper-Towards the 5 cent Tag."
BiStatix Industrial Applications, Five (5) pages.
Charles J. Murray, "Smart cardboard ready to roll, say Motorola and International Paper.", EETIMES, <http://www.eetimes.com/showArticle.jhtml?articleD=10814658>, Three (3) pages.
Charlie Schmidt, "Beyond the Bar Code", Technology Review, Mar. 2001, Twenty-Nine (29) pages.
AllenField Innovative Design & Manufacturing, "Pack Expo International 2000", Nov. 5-9, 2000, Chicago, IL USA, Twelve (12) pages.
BiStatic Technology, A Whitepaper Version 4.1, Eleven (11) pages.
Motorola, BiStatix Desktop Reader/Writer Development Kit, Reference Guide BDK-1000, Ten (10) pages.
Motorola, Grant Milner, Director, BiStatix Business Operations, "How Smart Labels Work", Apr. 17, 2001, Thirty-two (32) pages.
Motorola, BiStatix Technology Marketplace Solutions, Nine (9) pages.

* cited by examiner

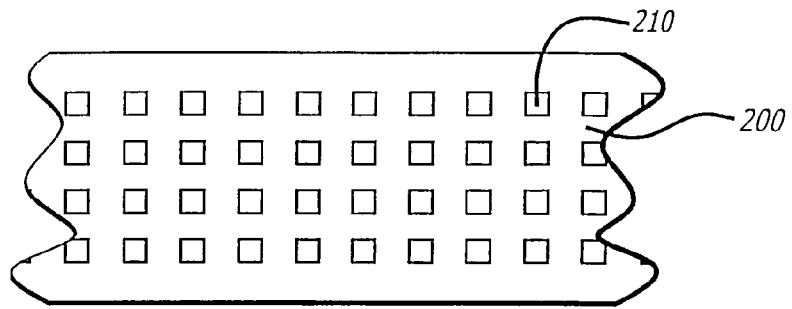
FIG. 1 *(Prior Art)*
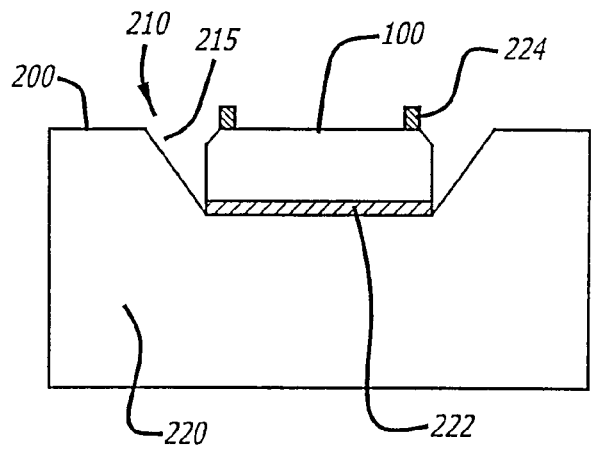
FIG. 2 *(Prior Art)*
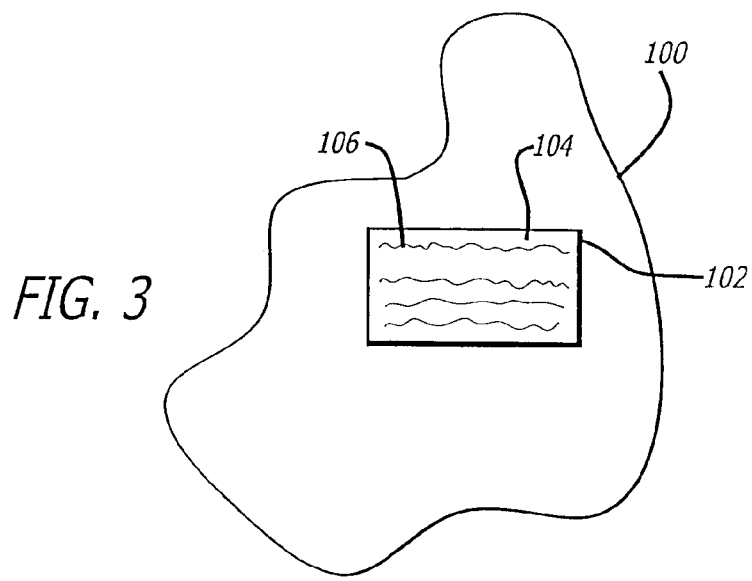
FIG. 3

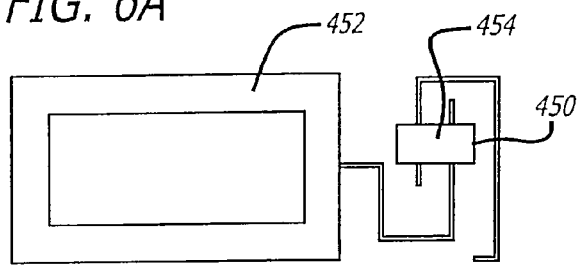
FIG. 6A
FIG. 6B
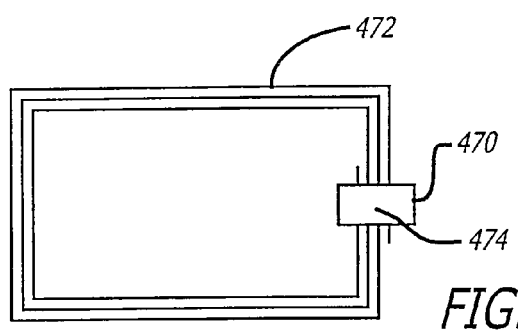
FIG. 6C
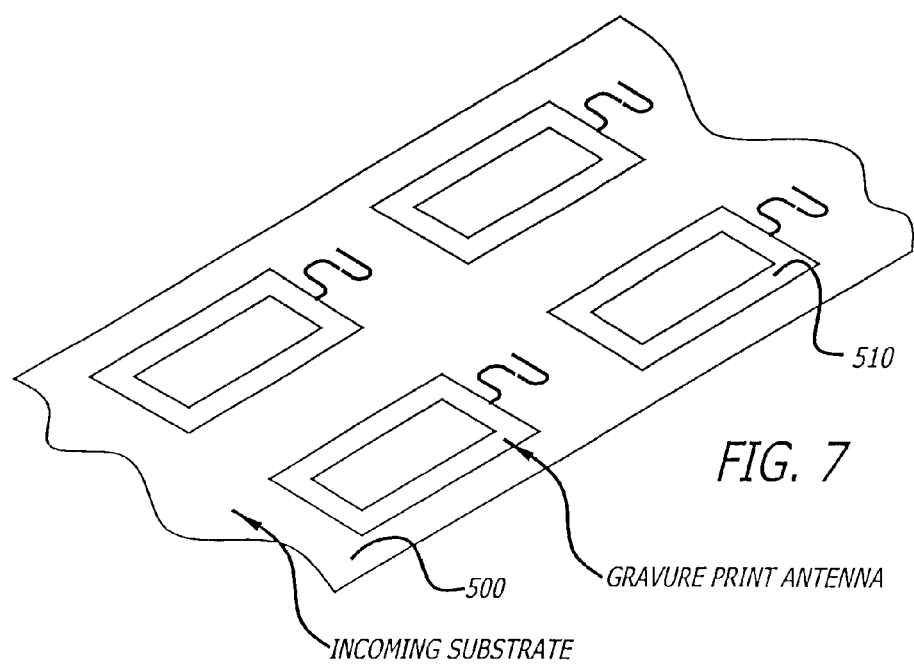
FIG. 7

RFID LABEL TECHNIQUE

CROSS-REFERENCE

This is a continuation of U.S. application Ser. No. 11/435,008, filed May 16, 2006 now U.S. Pat. No. 7,368,032, which is a division of U.S. application Ser. No. 11/166,284, filed Jun. 24, 2005 now U.S. Pat. No. 7,361,251, which is a continuation of U.S. application Ser. No. 10/323,490, filed Dec. 18, 2002, issued as U.S. Pat. No. 6,951,596, which claims priority to U.S. Provisional Patent Application No. 60/350,606, filed Jan. 18, 2002. This application is also related to U.S. patent application Ser. No. 09/776,281, filed Feb. 2, 2001, subsequently published as U.S. Patent Publication No. 2002/0149107 A2. All of the above applications are herein incorporated by reference in their entireties.

BACKGROUND OF THE INVENTION

1. Field of the Invention

This invention relates to the field of Radio Frequency Identification (RFID) tags and labels, and to particular methods of manufacturing them, including a roll-to-roll method of manufacture and an alternative sheet-to-roll method of manufacture.

2. Prior Art

RFID tags and labels have a combination of antennas and analog and/or digital electronics, which may include for example communications electronics, data memory, and control logic. RFID tags and labels are widely used to associate an object with an identification code. For example, RFID tags are used in conjunction with security-locks in cars, for access control to buildings, and for tracking inventory and parcels. Some examples of RFID tags and labels appear in U.S. Pat. Nos. 6,107,920, 6,206,292, and 6,262,692.

RFID tags and labels include active tags, which include a power source, and passive tags and labels, which do not. In the case of passive tags, in order to retrieve the information from the chip, a "base station" or "reader" sends an excitation signal to the RFID tag or label. The excitation signal energizes the tag or label, and the RFID circuitry transmits the stored information back to the reader. The "reader" receives and decodes the information from the RFID tag. In general, RFID tags can retain and transmit enough information to uniquely identify individuals, packages, inventory and the like. RFID tags and labels also can be characterized as to those to which information is written only once (although the information may be read repeatedly), and those to which information may be written during use. For example, RFID tags may store environmental data (that may be detected by an associated sensor), logistical histories, state data, etc.

Methods for manufacturing RFID labels are disclosed in PCT Publication No. WO 01/61646 by Moore North America, Inc., incorporated herein by this reference. The method disclosed in PCT Publication No. WO 01/61646 uses a number of different sources of RFID inlets, each inlet including an antenna and a chip. A plurality of webs are matched together and RFID labels are die cut from the webs, to produce RFID labels with liner. Alternatively, linerless, RFID labels are produced from a composite web with a release material on one face and pressure sensitive adhesive on the other, the labels formed by perforations in the web. Various alternatives are possible.

Still other RFID devices and methods for manufacturing RFID labels are disclosed in United States Patent Application Publication No. US2001/0053675 by Plettner, incorporated herein by this reference. The devices include a transponder comprising a chip having contact pads and at least two coupling elements, which are conductively connected with the contact pads. The coupling elements are touch-free relative to each other and formed in a self-supported as well as a free-standing way and are essentially extended parallel to the chip plane. The total mounting height of the transponder corresponds essentially to the mounting height of the chip. The size and geometry of the coupling elements are adapted for acting as a dipole antenna or in conjunction with an evaluation unit as a plate capacitor. Typically, the transponders are produced at the wafer level. The coupling elements can be contacted with the contact pads of the chip directly at the wafer level, i.e., before the chips are extracted from the grouping given by the wafer.

In many applications, it is desirable to reduce the size of the electronics as small as possible. Applicants' assignee Avery Dennison Corporation has been working with Alien Technology Corporation and others to identify materials, devise constructions, and develop processing techniques to efficiently produce rolls of a flexible substrate filled with "small electronic blocks".

Considering the flexible substrate filled with "small electronic blocks," Alien Technology Corporation ("Alien"), of Morgan Hill, Calif., for example, has developed techniques for manufacturing microelectronic elements as small electronic blocks, which Alien calls "NanoBlocks", and then depositing the small electronic blocks into recesses on an underlying substrate. To receive the small electronic blocks, a planar substrate 200 (FIG. 1) is embossed with numerous receptor wells 210. The receptor wells 210 are typically formed in a pattern on the substrate. For instance, in FIG. 1 the receptor wells 210 form a simple matrix pattern that may extend over only a predefined portion of the substrate, or may extend across substantially the entire width and length of the substrate, as desired.

To place the small electronic blocks into the recesses, Alien uses a technique known as Fluidic Self Assembly ("FSA"). The FSA method includes dispersing the small electronic blocks in a slurry, and then flowing the slurry over the top surface of the substrate. The small electronic blocks and recesses have complementary shapes, and gravity pulls the small electronic blocks down into the recesses. The end-result is a substrate (e.g., a sheet, a web, or a plate) that is embedded with tiny electronic elements. FIG. 2 illustrates a small electronic block 100 disposed within a recess 210. Between the block 100 and the substrate 220 is a metallization layer 222. The block 100 has a top surface with a circuit 224 disposed thereon.

Alien has a number of patents on its technique, including U.S. Pat. Nos. 5,783,856; 5,824,186; 5,904,545; 5,545,291; 6,274,508; and 6,281,036, all of which the present application incorporates by reference. Further information can be found in Alien's Patent Cooperation Treaty publications, including WO 00/49421; WO 00/49658; WO 00/55915; WO 00/55916; WO 00/46854 and WO 01/33621, all of which this application incorporates by reference. Another recent publication of interest appeared in the Information Display, November 2000, Vol. 16, No. 11 at pp. 12-17, and in a paper published by the MIT Auto-ID Center, entitled, "Toward the 5 Cent Tag," published in February 2002. Further details regarding the manufacture of the microstructure elements and the FSA processes may be found in U.S. Pat. Nos. 5,545,291 and 5,904,545, and in PCT/US99/30391 at WO 00/46854, the entire disclosures of which are hereby incorporated by reference.

As set forth in the MIT Auto-ID Center publication cited above, the electronic blocks may be located in the openings by a vibratory feeder assembly, such as that developed by Philips, instead of the Fluidic Self-Assembly method. Alternatively, the electronic blocks may be located into the openings with a deterministic pick and place method, which can use a robot arm to pick the electronic elements and place them one at a time into respective openings, as described in U.S. Pat. No. 6,274,508.

In yet another approach to locating the electronic blocks, the webstock or sheetstock may include openings that extend through the entire thickness of the sheet. A vacuum may be applied below the webstock to pull the electronic blocks into and to fill the openings.

The present invention addresses a significant need in these methods involving the placement of small electronic blocks or chips in or openings of a flexible substrate, as well as in more conventional surface mounting techniques for placing chips on flexible substrates. That is, it can be desirable to space the chips at densities exceeding the densities of antennas to which the chips later are bonded, e.g. antennas formed on webstock. The present invention provides this capability, furthermore, using techniques well suited to high speed roll-to-roll production of RFID tags and labels.

SUMMARY OF THE INVENTION

This invention relates to methods of making articles for RFID (Radio Frequency Identification), such as tags or labels. These methods process flexible webstock or sheetstock with embedded or surface mounted chips—herein called "RFID webstock" or "RFID sheetstock", respectively.

As used in this patent application, the "pitch" of elements on a webstock or sheetstock (such as chips within an RFID webstock, or labels within a label stock) means the center-to-center distance between adjacent elements. In the present invention, the pitch of chips may be different than the pitch of an array of RFID tags or labels to be formed: (a) in the longitudinal (also called the "down web") direction; (b) in the transverse (or "cross web") direction, or (c) in both directions. As used in the present patent application, the "pitch density", or the number per unit area e.g. of chips, is determined by calculating the reciprocal of the product of these pitches.

In accordance with one aspect of the roll-to-roll manufacturing method, the pitch density of the chips in RFID webstock or RFID sheetstock is different from (preferably significantly greater than) the pitch density of the individual RFID tags or labels within the roll of tags or labels. The difference in pitch density results from a difference in pitch in the down-web direction, in the cross-web direction, or in both directions. Typically the pitch of the chips along each axis of the RFID webstock is less than or equal to the pitch of antennas along the corresponding axis of the antenna web. This difference in chip density is attributable to the separation of the RFID webstock into "sections", and the adjustment of pitch density ("indexing") of these sections in the roll-to-roll lamination process. In one embodiment, the RFID webstock is die cut into a series of sections each containing a cross web column of chips, and the down-web pitch of chips is increased prior to lamination of the sections to a web containing antennas to form an RFID inlay stock. In another embodiment, the RFID webstock is die cut into a series of sections each comprising a lane containing a down-web row of chips, and these lanes are then spread or separated to increase the cross-web pitch of chips prior to lamination of the sections to a web containing antennas. In a third embodiment, an RFID webstock is first slit into lanes, and then individual sections are cut or separated from each lane in order to adjust the down-web pitch of the individual chip sections.

The method of the invention is adapted both to the use of RFID webstock and RFID sheetstock-as a carrier for RFID chips, the former being highly preferred. The term "RFID microelectronic stock" is used to encompass both RFID webstock and RFID sheetstock. These terms identify the webstock or sheetstock including RFID chips and electrical connectors, but before joining to antennas. Once the individual chips are associated with corresponding antennas, this patent application uses "RFID inlay" to identify individual chip-antenna assemblies, and the term "RFID inlay stock" to identify a webstock containing such RFID inlays.

In a preferred embodiment, the pitch density of the chips in the RFID inlay stock is the same as the pitch density of the chips in the final tag or label stock. However, it is possible further to adjust the pitch density of the individual RFID inlays and chips as they are integrated into the final tag or label stock.

According to one embodiment of the invention, a method of forming an RFID article includes providing an RFID webstock having a plurality of recesses, each of the recesses containing an RFID chip. A second web is provided having antennas spaced thereon. The RFID webstock is divided (e.g. severed, or separated) into a plurality of sections, each of the sections including one or more of the RFID chips. The pitch of the RFID sections is indexed from a high pitch density on the RFID webstock, to a relatively low pitch density on an RFID inlay stock. The sections are attached to a plurality of antennas in an automatic continuous process, so that each of the RFID chips is joined to (placed in ohmic communication with) one of the antennas to form an RFID inlay stock.

According to another embodiment of the invention, a method of forming an RFID article includes providing an RFID webstock of polymeric material having an array of RFID chips. A second web is provided having antennas spaced thereon. The RFID webstock is divided into a plurality of sections, each of the sections including one or more of the RFID chips. The pitch of the RFID sections is indexed from a relatively high density on the RFID webstock, to a relatively low density on an RFID inlay stock. The sections are attached to a plurality of antennas in an automatic continuous process, so that each of the RFID chips is adjacent to one of the antennas to form an RFID inlay stock.

According to other embodiments, the dividing and indexing steps may be effected using a cutter member and a transport member, the RFID webstock being passed through a cutting location between the cutter member and transport member, wherein sections are cut from the RFID webstock and engaged by the transport member. The transport member may convey sections from the cutting location to a transfer location at which each of the sections is joined to an antenna. The cutter member and transport member may be, for example, rollers or belts. The transport member may engage sections with vacuum holders or clamps.

In the indexing step the down-web spacing of RFID chips on the RFID webstock may be increased on the transport member, to match the spacing of antennas to which these chips are joined at the transfer location. The indexing step may further include the step of transporting the RFID webstock so as to effect indexing of the down-web pitch of the RFID chips relative to the pitch of these chips on the transport member.

A step of indexing in the cross-web direction may be done by, for example, slitting the RFID webstock of polymeric material into lanes, and spreading the lanes apart. The lanes once separated can travel along diverging paths, or can be realigned to be travel along parallel paths (of increased cross-web pitch in comparison to the original cross-web pitch).

Another embodiment of the indexing step is to divide the RFID webstock into a series of cross-web columns of chips, which can be engaged on the transport member and indexed separately from other columns of chips.

The attaching step may be effected by pressing the transport member against a lamination member at the transfer location, at which the section and antenna web pass through a nip or an extended zone of contact between the transport member and lamination member. For example the transport member and lamination member may both comprise two rollers, or a roller and a belt, or two belts.

In another specific embodiment, the method may further comprise unrolling a first facestock roll and laminating the first facestock roll to the RFID inlay stock. A second roll of facestock may be unwound, and the facestock from the second roll may be attached to the RFID inlay stock opposite the first facestock. The method may further include the step of forming an adhesive label.

The antennas may be formed in any of a number of different ways such as, for example, (i) printing conductive ink; (ii) sputtering metal; (iii) laminating foil; and (iv) hot-stamping.

Considering aspects of the invention further, in one embodiment of a converting assembly to separate RFID sections and join them to antennas, the RFID webstock is severed into sections by passing the webstock through a cutting location between a cutter member and a transport member. Preferably, the transport member acts as an anvil as sections are cut from the RFID webstock. In one embodiment, the transport member and cutter member are rollers; alternatively one or both of these members may comprise a belt. The transport member may include holders for engaging the cut sections, such as vacuum holders or clamps. The transport member conveys the sections from the cutting location to a transfer location, at which the sections are joined to antennas to form RFID inlay stock. Preferably the antennas are carried on a webstock.

In the preferred operation of this converting assembly, the transport of the RFID webstock, the operation of the cutter member, and the engagement of the sections by the transport member, are controlled so as to increase the pitch of the RFID chips from a relatively narrow pitch to a relatively wide pitch. Preferably the converting assembly increases the down-web spacing of the chips. In one embodiment, the transport of the RFID webstock may include a shuttle that induces periodic forward and retrograde motions of the RFID webstock. Preferably, the motion of the transport member at the transfer location matches the motion of an antenna-carrying webstock, to register the sections with respective antennas.

This converting assembly may act upon an RFID webstock containing a single lane of chips (which may have been slit from a webstock with a plurality of lanes of chips). In this case, a plurality of such converting assemblies would be provided, one for each lane of chips. Alternatively, the converting assembly may act upon webstock containing a plurality of lanes, wherein each severed section would include a cross-web column of chips.

At the transfer location of the converting assembly, the sections may be subjected to one or more of the following to facilitate joinder to antennas: heat, pressure, and actinic radiation. Conductive or non-conductive adhesive may be employed to bond chips to antennas. A lamination member such as a roller or belt may form a pressure nip or extended pressure zone to ensure a durable bond between microelectronic elements and antennas. The configuration of chips within respective sections, and the configuration of antennas and other structures, may be designed to minimize mechanical stress on chips during pressure bonding.

In accordance with one illustrative method implementing the present invention, a high pitch density RFID webstock (or sheetstock) containing semiconductive chips is provided and, in a continuous process, a web bearing relatively widely spaced antennas is provided to receive individual chips, with the pitch of the chips being changed or greatly increased, as the input web is die cut. The resultant individual chips are associated with corresponding antennas forming an RFID inlay stock.

The RFID webstock includes an array of chips each with associated circuits. In one embodiment, the array of chips of the RFID webstock forms a regular pattern such as an orthogonal pattern of down-web rows and cross-web columns. In this method, the RFID webstock is severed or separated into a plurality of sections each including one or more of the chips, and these sections are then joined or laminated to an antenna layer to form an RFID inlay stock. This RFID inlay stock may then be joined to other layers to form an RFID label stock or tag stock wherein each tag or label preferably includes a single chip. An RFID label stock or tagstock may be a multi-layer structure. A facestock printable layer may be an upper layer that forms a top surface of the substrate. The label stock or tag stock may also include a bottom layer such as a release liner or second facestock.

Features of the invention may include the use of a special substrate for the RFID microelectronic stock, which is easily die cut, has dimensional stability, thermal stability and/or other desirable properties as discussed heretofore. A preferred substrate is amorphous thermoplastic material that may be in the form of a flexible web capable of being wound about a core. Alternatively, the substrate for the RFID microelectronic stock may comprise paper or other thin flexible material.

In one embodiment of the invention, the RFID webstock contains an array of recesses, nominally each of which contains a respective chip. The recesses may be at least about 5 μm deep in some embodiments, and a recess may have a substantially rectangular bottom surface and four outwardly sloping side walls. Alternatively, the RFID webstock may be without recesses, wherein the chips are secured to unindented surfaces of the webstock.

This Summary of the Invention summarily describes certain aspects of the claimed subject matter, but is not a complete description of the invention. The Detailed Description, Drawings and the claims further identify and describe features and aspects of the invention.

BRIEF DESCRIPTION OF THE DRAWINGS

FIG. 1 illustrates a pattern of embossed wells on the surface of a portion of a web, into which small electronic blocks of complementary shape may be embedded;

FIG. 2 illustrates a small electronic block embedded in a well in a section cut out from an embossed substrate;

FIG. 3 illustrates an RFID label adhered to a substrate;

FIGS. 6A, 6B and 6C are views of an RFID section attached to antennas;

FIG. 7 is a perspective view of an antenna web;

DETAILED DESCRIPTION OF THE INVENTION

I. Introduction

Figure 4:
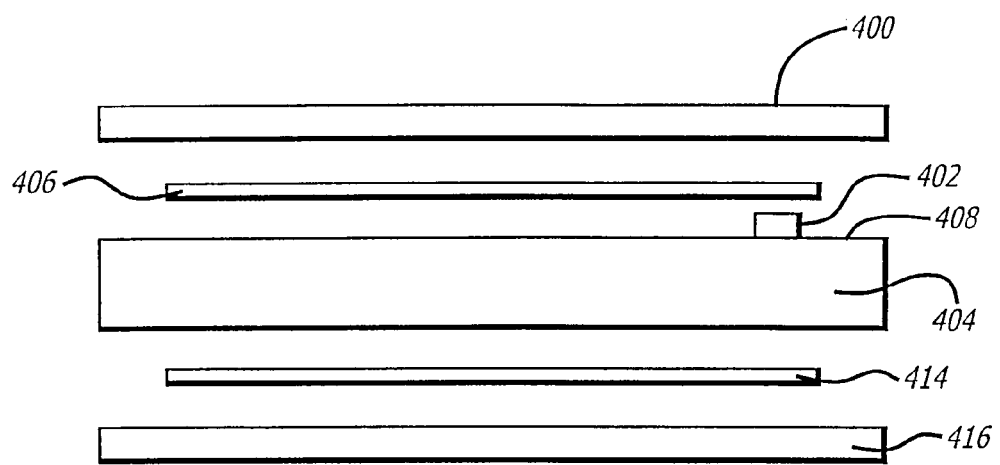
FIG. 4 is a cross-sectional view of one embodiment of a multi-layer construction formed during the manufacturing process.

By way of overview, a low cost method of RFID label or tag utilizes at least three elements. One element is an RFID webstock or RFID sheetstock i.e. a continuous web or sheet that contains microelectronic elements or RFID chips in an array, as well as electrical connectors for the chips. In the method of the invention, the webstock or sheetstock is separated into a series of "sections" each of which may be incorporated in a given RFID label or tag. Typically, each section includes one of the RFID chips, as well as electrical connectors for that chip. In one embodiment, the RFID webstock or sheetstock includes a microembossed array of recesses with the RFID chips secured within these recesses; alternatively the chips may be secured to unindented surfaces of the RFID webstock or sheetstock. Note:

The present patent application interchangeably uses the terms of RFID "chips", "IC's", "microelectronic elements", and in certain cases "blocks" in reference to these elements, whether they are embedded in the webstock or sheetstock, or mounted to an unindented surface of the stock.

The method of the invention is adapted to the use of RFID webstock and RFID sheetstock as a carrier for RFID chips, the former being highly preferred. The term "RFID microelectronic stock" is used herein to encompass both RFID webstock and RFID sheetstock. These terms identify the webstock or sheetstock including RFID chips and electrical connectors, but before joining to antennas. Once the individual chips are associated with corresponding antennas, this patent application uses the term "RFID inlay" to identify individual chip-antenna assemblies, and the term "RFID inlay stock" to identify a webstock containing such RFID inlays.

Another element is a continuous web of a plurality of antennas made from, for example, copper, silver, aluminum or other thin conductive material (such as etched or hot-stamped metal foil, conductive ink, sputtered metal, etc.). A third element is a continuous web or sheet of selected materials used to support and protect the RFID inlay stock, and/or to provide usable form factors and surface properties (e.g. printability, adhesive anchorage, weatherability, etc.) for specific applications.

The RFID microelectronic stock contains an array of chips at a pitch density that can be considerably higher than the pitch density in an RFID inlay stock that is formed using this RFID microelectronic stock. This high density can provide significant advantages, such as facilitating the placement of microelectronic elements using an FSA process, or other chip placement process. Preferably, the pitch density of the chips in the RFID inlay stock is the same as the pitch density of the chips in final tag or label stock. However, it is possible further to adjust the pitch density of the individual inlays and chips as they are integrated into the final tag or label stock.

A series of antennas are formed on a continuous web made of film, coated paper, laminations of film and paper, or other suitable substrate. Preferably, the pitch density of the antennas is engineered to the specific dimensions of the label or tag within which it will be formed, and independent of the pitch density of the sections.

The microelectronic stock and the antenna web are transported through a converting process that indexes and individualizes the microelectronic sections to a position associated with each antenna. The process affixes the sections to the antenna using conductive inks or adhesives applied to the antenna web, forming the RFID inlay stock. In the preferred embodiment, the inlay stock includes a matrix surrounding the sections, which may be discarded. Alternatively, the inlay stock may be butt cut so as to eliminate a matrix between adjacent sections (e.g. in the down web direction, or in the cross web direction).

The RFID inlay stock is then laminated above and/or selected label or tag materials made of films, papers, laminations of films and papers, or other flexible sheet materials suitable for a particular end use. The resulting continuous web of RFID label stock or RFID tag stock may then be overprinted with text and/or graphics, die-cut into specific shapes and sizes into rolls of continuous labels, or sheets of single or multiple labels, or rolls or sheets of tags.

Considering now details of specific embodiments, FIG. 3 illustrates a substrate 100 onto which an RFID label 102 has been adhered. This embodiment of a label includes an upper, printable surface 104, and printed text and/or graphics 106.

FIG. 4 is a cross-section of a multi-layer label stock or tag stock from which RFID labels and/or tags may be formed. The embodiment includes a top web or facestock layer 400 for carrying printing. A section 402 is provided in conjunction with a center web 404, onto which an antenna 408 (e.g. of conductive ink or foil) is printed, sputtered, laminated or otherwise deposited. A layer of adhesive 406 adheres the facestock 400 to the inlay web 404.

Figure 5:
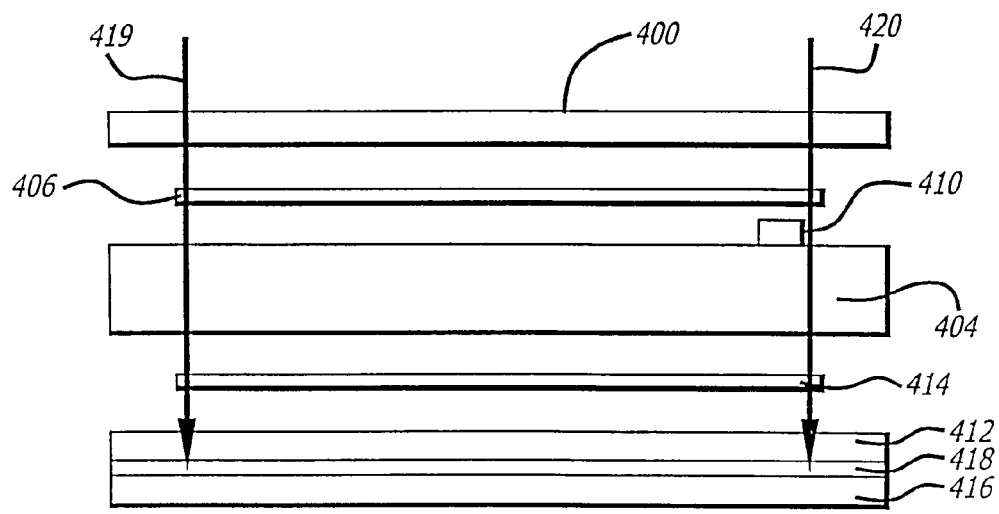
FIG. 5 is a cross-sectional view of the multi-layer construction of FIG. 4 upon die-cutting, after face material, adhesive and liner have been added.

FIG. 5 illustrates the multi-layer structure of FIG. 4 as adapted to be cut into a label. A layer of adhesive 414 adheres the inlay web 404 to another layer of facestock material 412. A layer of pressure sensitive adhesive 414 underlies the facestock layer 412, and is covered with a silicone-coated release liner 416. Areas at which the label is cut are indicated by arrows 419 and 420.

A general purpose, permanent pressure sensitive adhesive or a laminating adhesive is preferred for adhering the layers of facestock together. A wide variety of permanent pressure sensitive adhesives are well known in the art. The pressure sensitive adhesive may be one of any number of different types of adhesives, such as acrylic and elastomeric pressure sensitive adhesives. If the label construction illustrated in FIG. 5 is to be printed in a printer that generates high heat, such as a laser printer, the adhesive layer 414 may be made to be temperature stable, such as is disclosed in Avery Dennison's U.S. Pat. No. 4,898,323, incorporated herein by this reference.

As a further alternative, rather than coating the bottom layer 412 with a pressure sensitive adhesive layer 414, the bottom layer 412 may be coated with a water activated adhesive, a heat activated adhesive, other types of adhesives known in the art, or no adhesive at all (in the case of a tag). Layer 412 could be a printable material, such as paper or a coated polymer, for use in situations where a user wishes to print the front and/or the back of the label in a printer by omitting the additional layers 418 and 416 during the laminating and converting process. In the case of a dual sided tag used, for example, on clothing, a hole may be punched in one end of the tag and a plastic fastener, string or other fastening means is inserted through the hole.

The adhesive that is used in layer 418 may be any of a variety of different types of adhesives, including a water activated adhesive, a heat or pressure activated adhesive, or any other adhesive known in the label art. The adhesive layers 406 and 414 are typically permanent adhesives, although various other adhesives may be used.

Suitable materials for facestock 400 include, but are not limited to metal foils, polymer films, paper, and combinations thereof. The materials can be textiles including woven and non-woven fabrics made of natural or synthetic fibers. The materials can be single-layered paper or film or they can be multi-layered constructions. The multi-layered constructions or multi-layered polymeric films can have two or more layers, which can be joined by coextrusion, lamination, or other processes. The layers of such multi-layered constructions or multi-layered polymeric films can have the same composition and/or size or can have different compositions or sizes. The facestock 400 can be any of the above sheet or film materials.

The label of FIG. 3 is typically die cut, as with a wedge die or other cutting method known in the label art. In FIG. 4, the label is cut so as to include the section 410. The die cut may extend all the way through the cross-section of the label or the cut may extend only down to the liner layer 416. In this instance, the liner may be kept as a unified sheet of standard sheet size, with one or more removable labels on top of the sheet, as is typical in the labeling art.

For example, the liner 416 may be cut to have dimensions of 8½ by 11 inches or 8½ by 14 inches so as to conform to the size of standard paper input trays for inkjet, laser and other types of standard home/office printers; alternatively, the liner 416 can be cut to other dimensions as required in specific applications. Each sheet may include a number of die cut RFID labels, which may have standard label sizes such as 1 by 2 inches, 1⅞ by 3 inches, or any of the many other standard label sizes known in the art, or even may be cut to custom size labels.

It is noted that the adhesive layer 418 and the corresponding release liner 416 may be omitted, in the event that a tag rather than a label is desired. A water-activated adhesive or other type of adhesive may be used instead of the pressure sensitive adhesive 414, depending upon the surface to which the label is to be applied, and/or the bonding properties that the user wishes the label to have. For instance, a small-sized RFID label may take the form of a stamp, such as a postage stamp, that may include a layer of water-activated adhesive.

FIGS. 6A-6C illustrate sections 450, 460 and 470, respectively, attached to respective antennas 452, 462 and 472. The sections bear respective RFID chips 454, 464 and 474. The sections may be attached to the antennas in any of a number of different ways, such as crimping, soldering, or bonding with a conductive or nonconductive adhesive, for example. Preferably, the attachment of sections to antennas forms an ohmic connection between electrical contacts of the chip and leads of the antenna. Capacitive connections are also possible.

II. Preparation of the Receptor Film

In one embodiment of the invention, the initial step in manufacturing an RFID tag or label forms receptor wells or holes in a polymeric film substrate, herein sometimes called a "receptor film". In the preferred embodiment, the polymeric film substrate is a material selected from the preferred class of polymeric films described in commonly assigned U.S. patent application Ser. No. 09/776,281, filed Feb. 2, 2001, entitled "Method of Making a Flexible Substrate Containing Self-assembling Microstructures." The receptor holes are formed in this substrate film using the precision continuous embossing process disclosed in the '281 patent application. These polymeric materials, and the preferred process for forming receptor wells, are described below. Alternatively, the polymeric film substrate may be selected from the polymeric materials described in Alien Technology Corporation's patent applications, such as PCT International Publication WO 00/55916. Alternative techniques for forming microstructure receptor wells or holes in the polymer film substrate, as described in Alien's patent publications, include for example stamping and injection molding.

The polymer film includes wells that are filled with tiny electronic component chips via a Fluidic Self-Assembly (FSA) process, such as that developed by Alien Technology Corporation of Morgan Hill, Calif. Then, a planarizing layer is coated on top of the filled wells. The purpose of the planarization is to fill any gaps that still may be present; to provide a smooth, flat surface for later processes, such as the etching of vias; to assure that the microelectronic block elements (i.e. chips) are maintained in position in their recesses on the substrate during further processing steps; and to provide mechanical integrity for the laminate. "Vias" are then created with etching techniques. The vias are then coated with aluminum to form a pair of pads on opposite sides of the chip for electronic connection. The polymeric film web at this stage of the process, with embedded chips and associated pads, is referred to in the present application as an "RFID webstock" (or in the case of a sheet substrate, "RFID sheetstock").

In a preferred embodiment of this invention, the RFID webstock or sheetstock is then cut or separated into a series of sections each of which include one or more electronic component chips, with associated planarization layer and conductive pads. Each cut or separated portion of the RFID microelectronic stock is referred to herein as a "section." Alien Technology Corporation recognized a principal advantage of the use of RFID sections in this embodiment: They permit the fabrication using FSA techniques of RFID webstock or RFID sheetstock with higher density of chips (and hence a lower manufacturing cost) than the density of arrays of RFID devices into which the chips are to be incorporated. Thus in the case of a grid of chips arrayed longitudinally and transversely of the web, the pitch of chips (i.e. center-to-center distance between adjacent chips) may be different than the pitch of an array of RFID tags or labels to be formed: (a) in the longitudinal (also called the "down web") direction; (b) in the transverse (or "cross web") direction, or (c) in both directions. The "pitch density" is determined by calculating the reciprocal of the product of these pitches. Thus, an example of a downweb pitch is 5 mm, a cross web pitch could be 10 mm, and in this example the pitch density could be 200 chips per $m^2$.

If the sections separated from the RFID webstock or RFID sheetstock each contain a single electronic component chip, with associated planarization layer and conductive pads, these sections are then in suitable form to incorporate in individual RFID tags or labels. Alternatively, the sections may contain a plurality of electronic component chips (with electrical connectors). For example an RFID webstock may be slit into a series of longitudinal lanes each containing a single row of microelectronic blocks. At a later point in the process, individual sections can be severed or separated from these lanes to form individual RFID tags or labels. Handling the RFID sections poses various manufacturing problems in separating the RFID sections from the RFID webstock and in physically integrating the RFID sections into an RFID inlay stock (and then, label stock or tag stock) in a roll-to-roll lamination process. Applicants have overcome these problems in the present invention, as described below.

The size of each individual RFID section is largely independent of the size of the associated finished label, subject to the constraint that the section cannot be larger than the label. In one embodiment, the section measures approximately 6 mm by 2 mm. In alternative embodiments, the section measures 10 mm by 2 mm and 4 mm by 2 mm, respectively. The size of the section may vary, however, and these dimensions are merely examples.

III. Method of Manufacturing RFID Labels

Considering now a method of manufacturing RFID labels, one such method utilizes large rolls of the various layers. That is, the inputs to the process include large rolls of facestock; a substrate roll that is processed to form the RFID webstock; and a base material roll on which antennas are printed or bonded, or alternatively a base material roll with pre-formed antennas; and possibly rolls of other materials.

Figure 8:
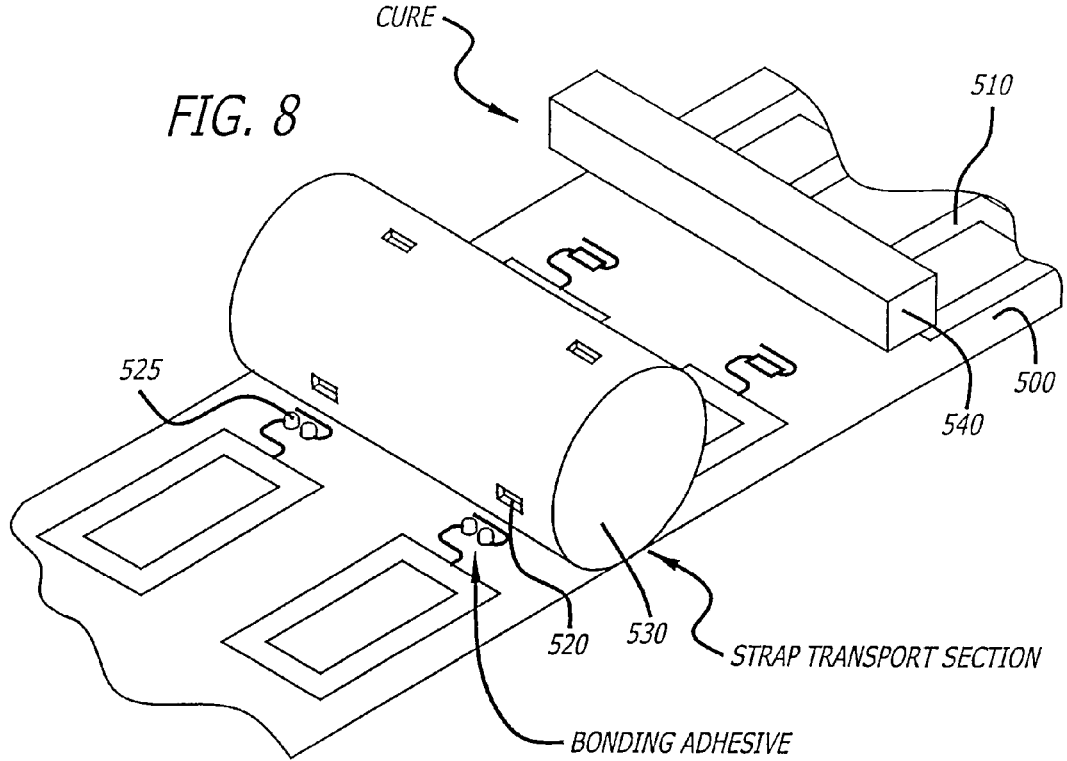
FIG. 8 illustrates a process of applying RFID sections to antennas on a web.

FIG. 7 illustrates a web 500 into which antennas 510 are printed or otherwise formed. Once antennas are on the web, individual sections bearing RFID chips are affixed to the antennas, as FIG. 8 illustrates, In one approach, sections 520 are held against an anvil 530 by a vacuum. The sections 520 are deposited onto contacts 525 for the antennas.

The sections may be affixed to the antenna contacts by means of an adhesive such as a conductive epoxy adhesive. The adhesive may be cured with heat and/or pressure at 540.

Figure 9:
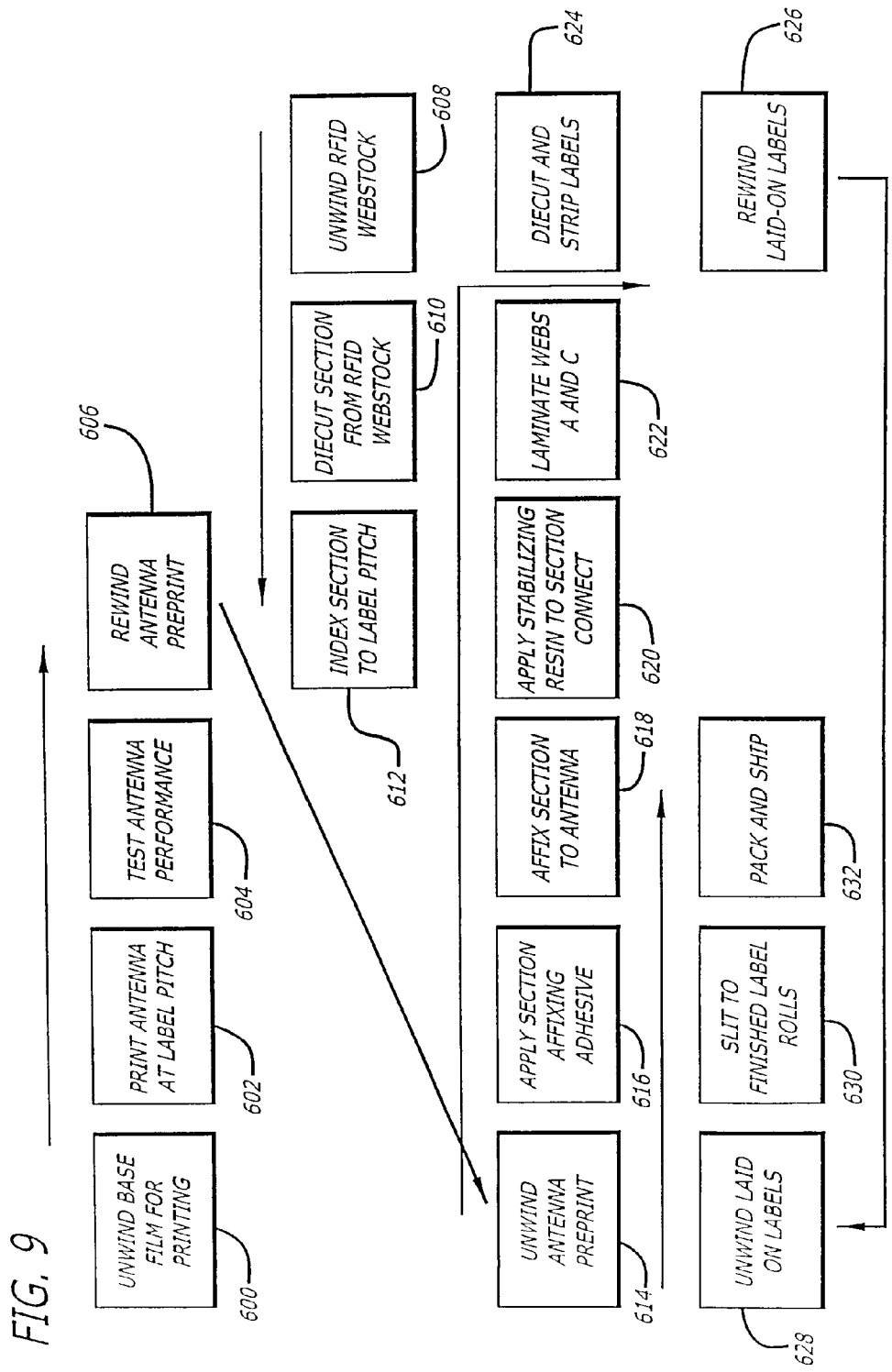
FIG. 9 illustrates steps in a process for forming RFID labels.

FIG. 9 is a block diagram illustrating steps in one method of manufacturing an RFID label using such rolls. At step 600, a roll of base film is unwound for printing. At step 602 an antenna is printed onto the base film at a pitch corresponding to the pitch of the labels. At step 604 the performance is tested before the manufacturing process proceeds further. At step 606 a roll of preprinted antennas is rewound.

The cross-web width of the antenna web may be any of a number of different widths. In one embodiment, the cross-web width is 16 inches. The pitch of antennas and spacing between antennas would depend on the intended label dimensions and spacing of labels on the final label stock, typically would be in a range from about 0.5 inch to 32 inches. A typical spacing between adjacent antennas is about 0.125 inch, but such spacing can be greater or smaller, if desired.

Figure 17:
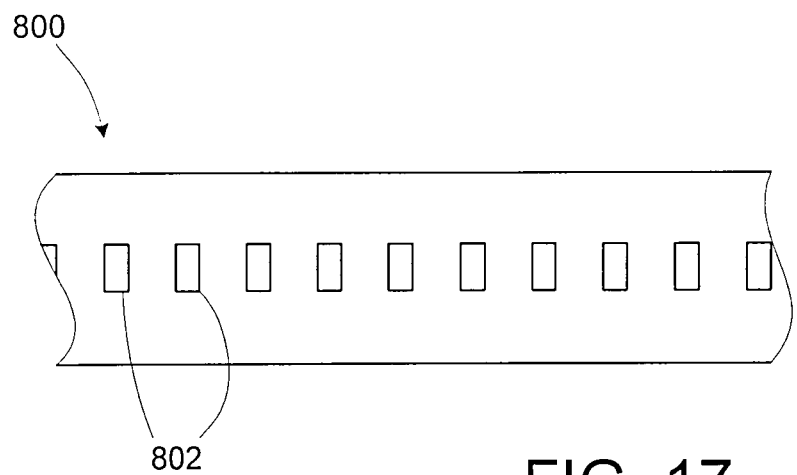
FIG. 17 is a diagram illustrating an RFID webstock with a single row of ICs (chips)
Figure 18:
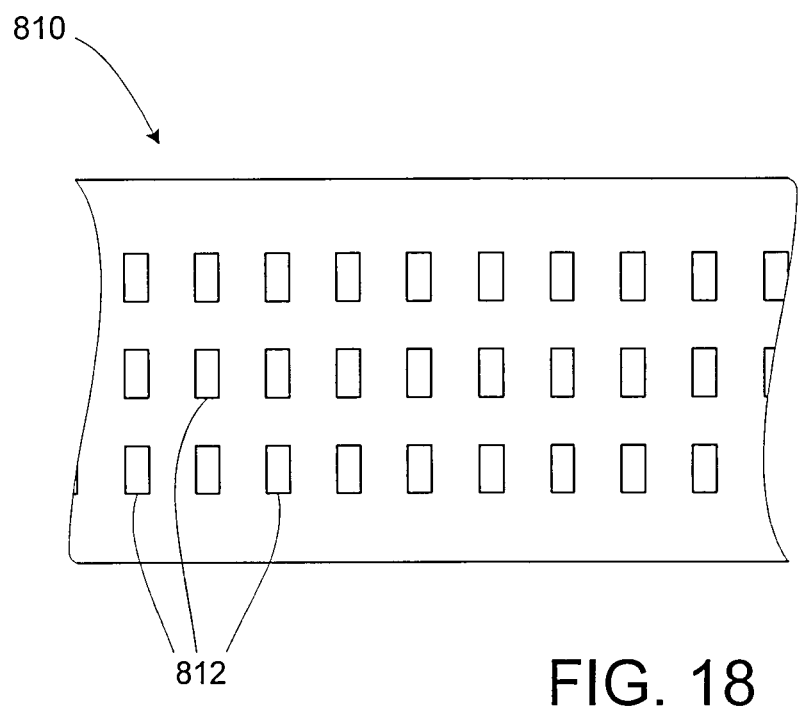
FIG. 18 is a diagram illustrating an RFID webstock 810 with multiple rows of ICs (chips) 812

In the second phase of the label manufacturing process (which may be continuous or discontinuous with the first phase), a roll of RFID webstock is unwound at step 608. The configuration of small electronic block ICs on the receptor film may vary depending on the particulars of the IC placement process (such as FSA), the requirements of the RFID application (and associated specifications of the RFID chip and/or antenna), and other factors. For example, there may be a single row of small electronic block ICs along the web, or there may be multiple rows. FIG. 17 is a diagram illustrating an RFID webstock 800 with a single row of ICs (chips) 802, and FIG. 18 is a diagram illustrating an RFID webstock 810 with multiple rows of ICs (chips) 812. For reasons of economy, it is typically desirable to put as many ICs on the web as possible and for this reason small, densely packed IC's (small electronic blocks) are desirable. That is, in one embodiment, the "pitch density" of the small electronic blocks is maximized. As previously noted, the "pitch density" is the reciprocal of the product of the "down web" or longitudinal pitch and the "cross-web" or lateral pitch.

Individual sections are cut or separated from the web at step 610. The cutting may be accomplished by die cutting or by other cutting methods in the art, such as laser cutting, perforating, slitting, punching, or other known means that can scribe to specific shapes and sizes. The cut sections are then indexed in such a way as to match the pitch of the antennas (which typically is the same as the eventual pitch of the labels). The pitch of the labels depends on the size of the labels, which can vary from application to application. Typically, as discussed previously, the sections are provided at a predetermined spacing, and must be "indexed" to match the spacing that is required for the size of the particular type of label into which the section will be incorporated. The indexing may affect the down-web spacing of the sections, the cross-web spacing, or both.

As further background, it should be noted that the pitch density of the ICs will generally be greater than the pitch density of the finished label sheets. Small electronic block ICs can be packed more closely to one another on their web than the labels. For example, it may be possible to have an eight inch wide web of small electronic block ICs and a sixteen inch wide sheet of labels, if the pitch of the sections bearing the small electronic block ICs is adjusted after the sections are cut from the web to match the cross-web pitch of the labels. The only requirement is that there be a one-to-one correspondence between the number of lanes of chips, and the number of lanes of labels.

An indexing device can be used to control the relative speed of the web that bears the ICs, relative to the speed of the web bearing the antennas, so as to space individual IC's appropriately with respect to the antenna web. This longitudinal (down-web) indexing device brings the sections into alignment with the antennas, so that a section is properly positioned relative to the antenna and can be bonded to the antenna.

Figure 10:
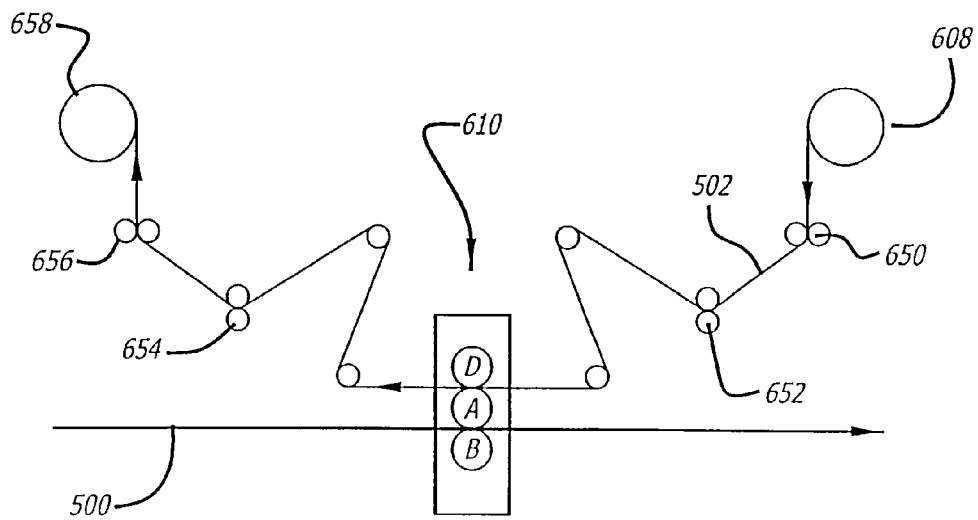
FIG. 10 illustrates a process for indexing RFID sections to antennas in a vertical or machine direction.

Referring now to FIG. 10, the RFID Webstock 502 from the unwind 608 is tensioned and passed between the cutting die "D" and an anvil "A." The web passes through rollers at an in-feed tension isolator 650 and an in-feed drive 652 on its way to cutting die "D" and anvil "A." The anvil "A" contains vacuum holding stations on its surface that correspond to the layout of antennas on an antenna web. The anvil includes a hard surface, and is typically of the same diameter as the die so that as they rotate together, they are in the same position relative to one another on any plane on their surface. The die cuts each individual RFID section out from the matrix of surrounding RFID webstock.

Figure 11:
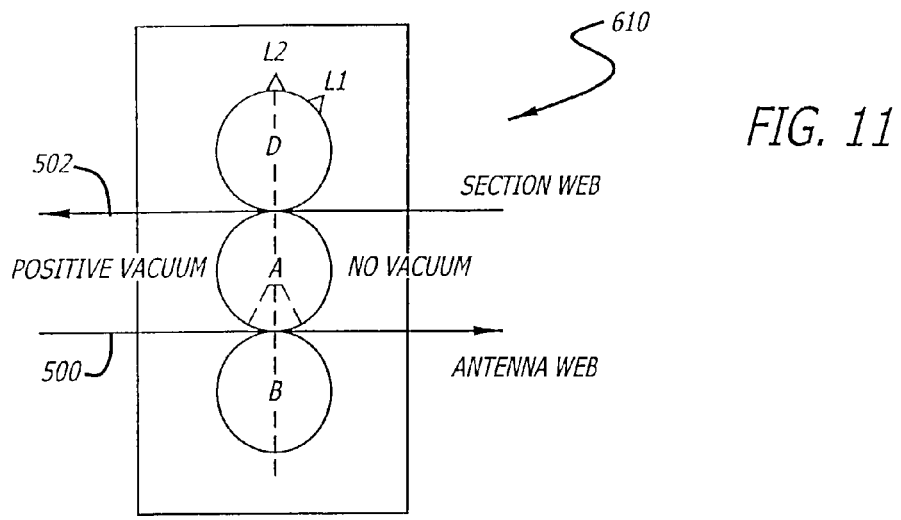
FIG. 11 is a detail of the process of FIG. 10, illustrating in particular a die and anvil arrangement.

Referring to FIG. 11, vacuum anvil A counter-rotates with "D" and "B" which allows the section to be transported from the surface of "D" to a position at which the section is joined to an antenna, in this case a nip between rollers "A" and "B." The antenna web passes between anvil "A" and base anvil roll "B" which acts as a lamination member. Roller B has a stepped surface to accommodate the thickness of the antenna web such that the diameters of the rollers can be matched to allow for rotational registration and tangency of the roller's surfaces with the sections and antenna web. Rollers "A" and "B" can form a pressure nip to facilitate the formation of a durable bond between electrical connectors of the chip, and the antennas. Additionally, heat and/or actinic radiation such as UV radiation (not shown) may be employed. This bond may be formed or enhanced using conductive or non-conductive adhesive. Additionally, these rollers may be used to crimp the two metal surfaces, of the section and of the antenna, with or without the use of adhesives. Following formation of this bond, the anvil roller "A" completes its rotation to accept the next sections.

Figure 12:
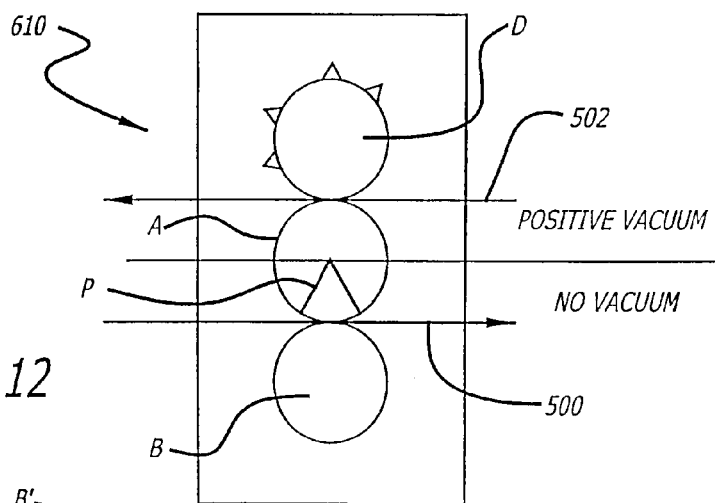
FIG. 12 is a detail illustrating a die and anvil arrangement.

The layout of FIG. 12 would yield a pitch at affixing of approximately twice the pitch of the section. Drawn in FIG. 12 is one half of the die face detail. Therefore, with each die rotation, four (4) consecutive sections are die cut. Die D is made with cutting faces to match the dimensions of the section. Each die section that die cuts individual sections has a leading edge L-1 and a trailing edge L-2, such that L-1 cuts the section web at the leading edge of the section, and L-2 completes the cut at the section's trailing edge.

For matching section and antenna pitch with optimal press speeds, it is necessary to select ratios between the number of cutting sections on die roller D relative to both the pitch of the sections and the pitch of the antenna, and to the relative diameters of rollers D and A.

After passing through the die station 610, the web passes through rollers at outfeed drive 654 and at-feed tension isolator 656, on its way to rewind 658.

Figure 13:
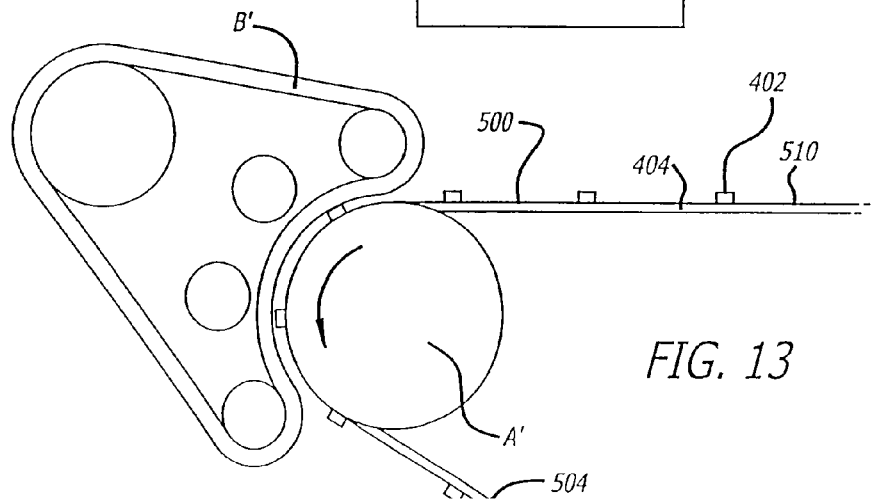
FIG. 13 illustrates an alternative arrangement utilizing a belt and rollers.

FIG. 13 illustrates an alternative pressure lamination member B, i.e. a metal or polymeric belt, for bonding antennas to sections on anvil roller A'. The use of a rotating belt B' provides an extended zone of elevated pressure and/or temperature to facilitate adhesive curing, and formation of a durable, metal-to-metal bond between the antenna and IC-connector structures. One or more additional set of belt or roller combinations (not shown) can be provided to further extend the zone of bond formation between the antenna and IC-connector structures.

Referring again to FIG. 11, the vacuum anvil A is generally designed to have a portion of its rotation with positive vacuum and a second portion without vacuum. In addition, a subsection of the rotational section without vacuum, designated by P, may be engineered to operate with positive pressure flow. Each of the three possible air flow sections can be engineered to be activated corresponding to the position of the section relative to rotation of A.

As L-2 completes its cutting of the section, vacuum is created at a surface of anvil roller A through ports corresponding to the section size. The section is therefore held against the surface of roller A as it rotates away from its tangent to die D. The matrix from the section web continues in its plane and is rewound as waste. (Alternatively, the section web can be butt cut, thereby eliminating the matrix).

When the RFID section, held on anvil roller A by positive vacuum approaches the tangential section with roller B, the vacuum is released, allowing the section to be engaged and held by the adhesive previously applied to the antenna web. If necessary, a positive air flow can be generated to push the section from the surface of A in section P; this airflow also may serve to clean the vacuum station. The section then moves with the antenna web.

Concerning down web (or longitudinal) indexing of the sections, the RFID webstock transport mechanism can be engineered to direct the web in either the left-to-right or right-to-left direction, on commands from an electronic controller. During the period commencing when the leading cutting die surface L1 first contacts the RFID webstock, and ending when the trailing cutting die surface L2 ends contact with the webstock, the web is transported right-to-left at the same speed as the antenna web. In between these cuffing cycles, the web transport control provides a controlled-acceleration left-to-right motion of the web, in order to place the next uncut section on the RFID webstock in alignment with the next set of cutting die surfaces L1, L2 on die D. This cycle is then repeated.

The roller D and its cutting sections can be configured so that there is a space between each cutting section that allows the section web to travel in the opposite direction from the motion of the die surface without contacting the die surface. By matching the space between cutting sections with the elapsed time to cycle the section web from one direction to another, the position of each section can be cut at different pitches relative to the position of each cutting section. Each cutting section of D can be made on the same pitch as the antenna so that as the section web shuttles between cutting and non-cutting sections of die D, each section is transported on anvil roller A at a matched pitch with the antenna that is moving between rollers A and B. This allows for high speed roll-to-roll processing of standardized (and therefore lower cost) sections, in a manner that can be adapted to a variety of custom layouts as is typically found in labels and tags.

In one version of the apparatus of FIGS. 9-12, the apparatus operates on an RFID webstock containing a single lane of chips, and a plurality of such apparatus is provided corresponding to the number of lanes of chips on the original RFID webstock. These lanes may be slit from the original RFID webstock, and optionally may be spread apart prior to processing by the vertical indexing apparatus. Alternatively, the vertical indexing apparatus may act upon an RFID webstock with multiple lanes of chips.

The lanes of the web that bears the sections must also be made to match the lateral (cross-web) pitch of the lanes of the web bearing the labels and the antennas. One way to ensure this "cross-web alignment" is to use one independent web of sections for every one independent web of labels and antennae. Another approach is to slit the respective webs longitudinally, and then align the slit lanes of sections to the cut lanes of labels and antennae. This can be done using a series of spreader rolls, much as is done in a conventional slitter assembly. Slitting methods are known and are disclosed in a number of U.S. patents including, for example, U.S. Pat. Nos. 3,724, 737, 3,989,575, 3,891,157, 4,480,742, all incorporated herein by reference, and European Patent Publication EP 0 979 790 A2, incorporated herein by reference. The spreader rolls divert the strands of small electronic block sections to provide one lane of sections for every lane of labels.

Another alternative approach is to cut the small electronic block web at maximum pitch density cross-web, and place the resulting lanes on a vacuum belt that spreads the lanes. Using apparatus of the type illustrated in U.S. Pat. No. 4,480,742, one may utilize a continuous expanding band or belt to separate the lanes in the cross-web direction. Alternatively, a series of laterally spaced belts may undergo increasing spacing to separate the lanes in the cross-web direction.

Concurrent with steps 608-612, the roll of pre-printed antenna is unwound at step 614. Adhesive for fixing the sections onto the pre-printed antennas is applied to the pre-printed antenna roll at step 616. The sections, which are indexed in accordance with the pitch of the labels, are affixed to the antennas at step 618.

A stabilizing resin may be applied to the bonded sections at step 620. The resin of step 620 serves to protect the small electronic block components and to fix them into place within the label. Also, the interface between the section and the antenna can be fragile. A resinous material may therefore be dispensed over the interface area, and then cured to a hard finish that stabilizes the interface from breaking from flexure, fatigue or the like. Examples of suitable resinous materials include silicon filled thermal curing epoxy or clear filled UV-curable acrylic resin. The epoxy or acrylic resin may be dispensed directly onto the interface area, or may be indirectly dispensed using a transfer device.

At step 622, one or more sheets of facestock are laminated to the web bearing the antennas and bonded sections. Referring back to FIG. 4, this step would, in the particular embodiment of FIG. 4, serve to adhere the facestock layer 400 to inlay layer 404. Likewise, additional layers such as face stock layer 412 can be laminated in positions above and/or below the inlay layer 404 such as is shown in FIG. 5.

Once the various layers of the label stock have been laminated together, the label stock may be die-cut into individual labels at step 624. The labels may also be cut into strips or into sheets, as desired. The labels may be rewound onto a take-up roll at step 626.

In the final phase of the manufacturing the die cut labels are unwound from the reel at step 628. Through a slitting operation at step 630, the die cut strips of labels are sent to individual lines for final processing. After slitting the web into individual strips, the strips may be cut into sheets. The sheets may then be packaged and shipped at step 632.

Figure 14:
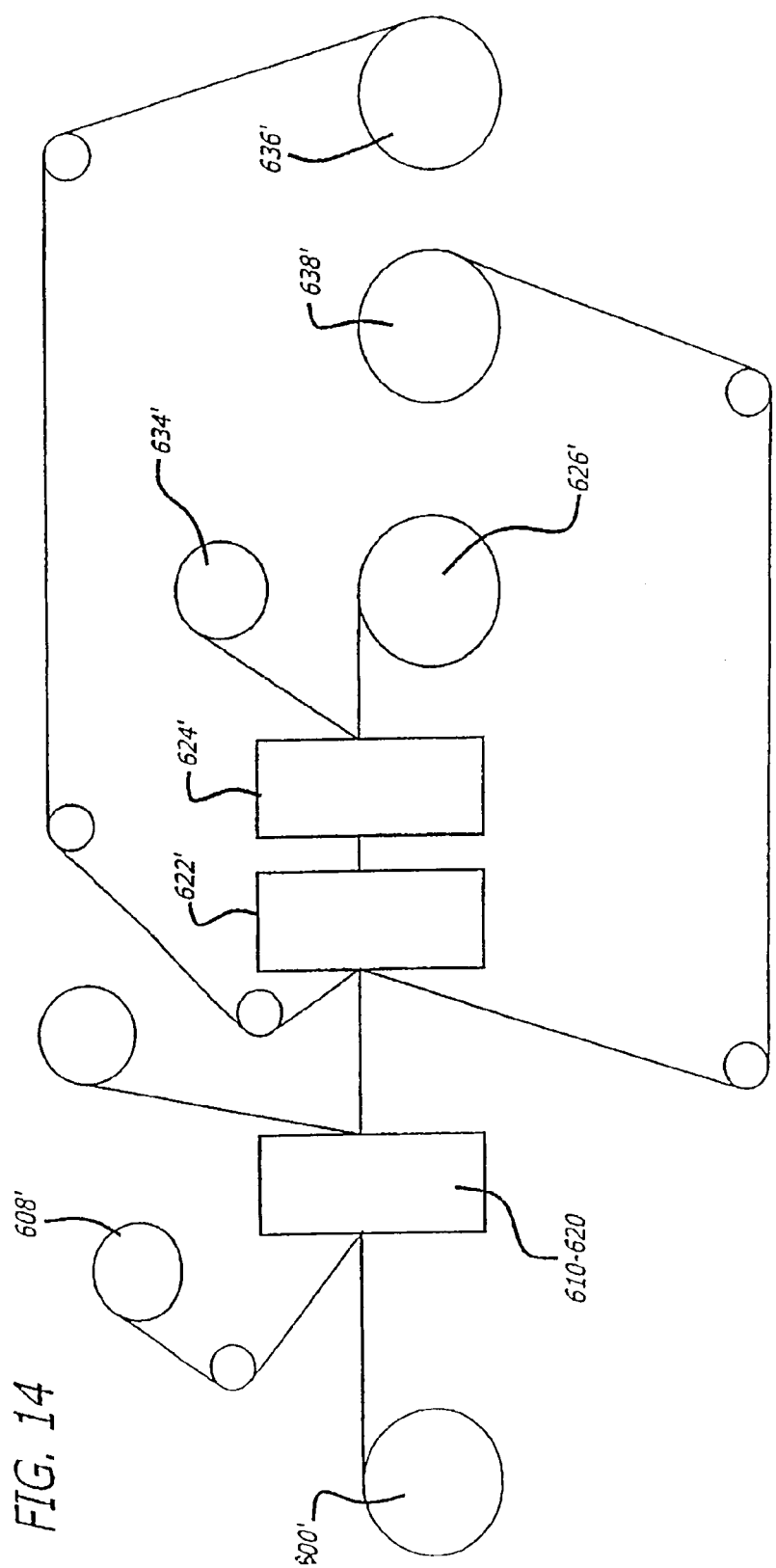
FIG. 14 is a simplified diagram illustrating components of a system for manufacturing RFID labels.

FIG. 14 is a simplified diagram of a manufacturing process for making RFID labels. The base film for printing is unwound at station 600'. The web bearing the small electronic blocks is unwound at step 608'. Steps 610'-620', which relate to die cutting and affixing the sections, are then accomplished.

Step 622 is generally accomplished in block 622', and the die cutting and stripping steps are accomplished at block 624'. The facestock is unwound at reel 636', and the adhesive-coated bottom web and release liner assembly is unwound at reel 638'. Alternatively unwind 638' may provide only a web of release liner to be laminated to adhesive coated directly onto web 500. The laid on labels are rewound at area 626'. The label matrix, which is the extra material left after the die cutting step, is rewound at station 634'.

Figure 15:
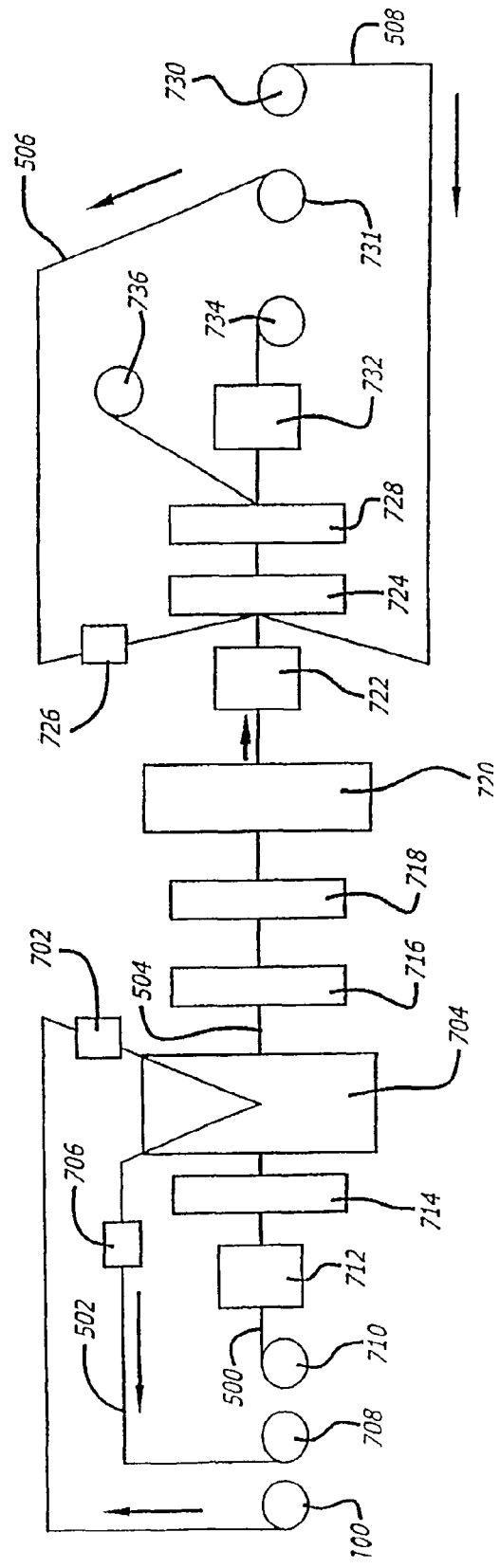
FIG. 15 is another diagram illustrating components of a system for manufacturing RFID labels.

FIG. 15 is a more detailed representation of a manufacturing process as compared to FIG. 14. FIG. 15 shows a number of different stations that accomplish various subprocesses. Considering one subprocess that begins at the left-hand side of the drawing, an unwind station 700 carries the RFID webstock described previously. The RFID webstock is unwound from station 700 and enters an in-feed station 702 and then enters a converting module 704. At the converting module 704, the RFID webstock is die cut into an array of sections, which are affixed to the pre-printed antenna web. The remainder of the webstock (waste matrix) is fed through out feed station 706 and ultimately is rewound onto a reel at rewind station 708.

Another portion of the manufacturing process illustrated in FIG. 15 relates to the printed antenna web 500, which is provided in a reel at station 710. The pre-printed antenna web 500 is unwound from the reel at station 710, then proceeds to an in-feed station 712. The preprinted antenna web 500 proceeds to a printing or coating station 714, at which adhesive is applied to the web. The web 500 continues to station 704 where the array of RFID sections are affixed to the pre-printed antennas to form an RFID inlay stock 504. The RFID inlay 504 stock proceeds to station 716, at which the affixing adhesive is post-cured (e.g. for a B-staged adhesive). Methods for curing adhesives are known in the art and, by way of example and not limitation, include heat curing, UV, and infrared curing methods.

An additional stabilizing resin may be applied at a station 718. As described previously, the resin may serve to protect the small electronic blocks and to stabilize the blocks on the web. A station 720 can serve to inspect the RFID inlay stock, and maintain quality control. The RFID inlay stock then continues to an out-feed station 722, and through station 724. At station 724, a laminating adhesive may be applied to the top and bottom sides of the RFID inlay stock. A facestock laminate 506, which may be optionally pre-printed or which may be suitable for printing at the user's facility, travels through an in-feed station 726 and then to station 724 and station 728. At station 724 and/or 728, the facestock is laminated to the RFID inlay stock. At the same time a bottom layer 508, which may be pre-coated with a pressure sensitive adhesive on the bottom, is unwound from a station 730. The bottom layer 508 enters the stations 724 and 728, where the bottom layer is laminated to the web. The bottom layer that is unwound from the reel at station 730 may also include a release liner that covers the pressure sensitive adhesive on the bottom of the layer. The facestock layer is unwound from reel 731.

The fully laminated construction then passes through an out-feed unit 732. It is noted that there are two rewind reels—734 and 736. Rewind reel 734 takes up the laid-on labels. Rewind reel 736 takes up the die cut label matrix that is essentially waste material from the process in which the labels are cut. The die cutting operation may be carried out at station 728. It is noted that the cutting operation is not limited to die cutting, but may include other cutting techniques, such as laser cutting, perforating, slitting, punching or other methods known in the art.

Figure 16:
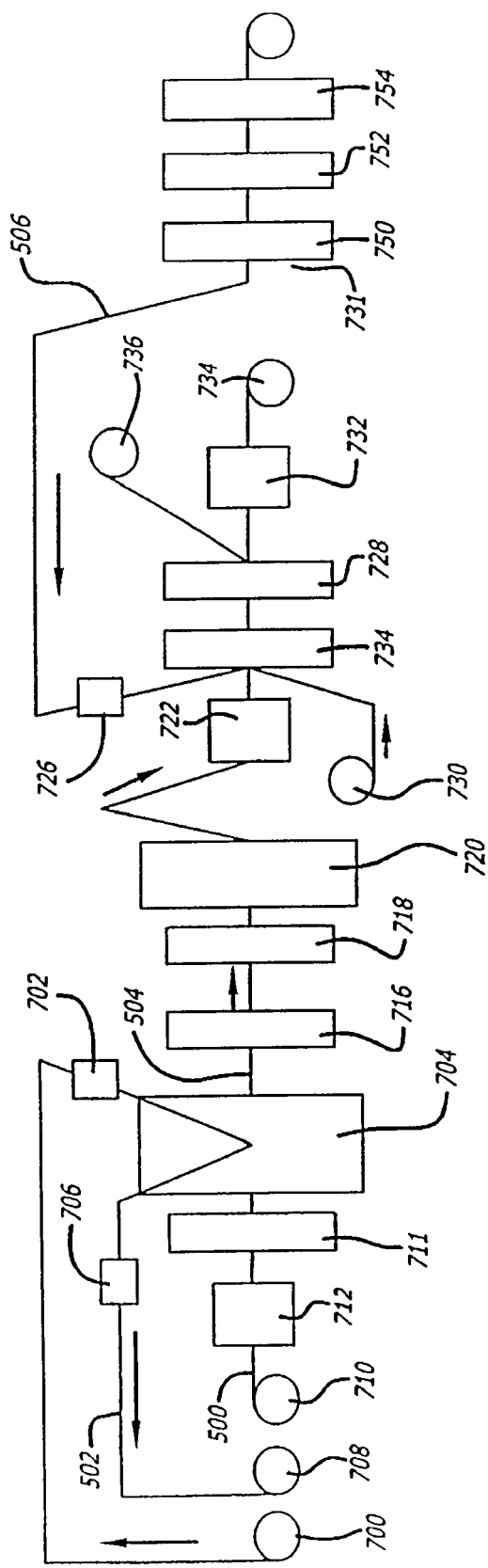
FIG. 16 is a further diagram illustrating components of a system for manufacturing RFID labels.

FIG. 16 illustrates an alternative arrangement in which stations 750, 752 and 754 serve to print graphics and/or text to the upper facestock after the facestock material is unwound from the reel. Three separate print stations 750-754 are shown to illustrate that the printing can be done by more than one printhead, such as in multicolor printing, if desired. However, it is also possible to print with only one printhead, as appropriate. As compared to the arrangement in FIG. 15, this process of FIG. 16 provides for printing onto the upper facestock in the same manufacturing line as the other steps in preparing the label stock. It may be desirable to print onto the facestock during label fabrication when, for example, variable information such as the identification information that is stored on a particular chip is to be printed on the corresponding label.

However, it is clear from FIG. 15 that the facestocks may be pre-printed before the facestock is wound onto the reel. That is, the pre-printing can be accomplished offsite at another facility or at another location besides the manufacturing line that accomplishes the various specific steps in making the label. Alternatively, the facestock may be partially preprinted offsite, with additional printing done in-line.

The foregoing has assumed that the IC or small electronic blocks are provided on a rolled web that is unwound during the manufacturing process. However, as an alternative, the receptor film with microchips may be provided in sheet form rather than rolled web form. The sections bearing the individual ICs would then be cut from pre-cut sheets, rather than from a roll, and these sections could be integrated into an RFID tag or label stock using a pick and place operation. To regulate the pick and place operation, the position of a section bearing a small electronic block may be registered on a corresponding label by, for example, using a CCD camera to detect a registration or alignment mark on or near the label. In lieu of the web-handling equipment illustrated above (e.g. for the indexing station, and the attaching station), sheet handling equipment may be employed.

The pick and place operation may be performed by a pick and place device, which may include mechanical and/or vacuum grips to grip a section bearing a small electronic block while moving it into the desired location in alignment with the label. It will be appreciated that a wide variety of suitable pick and place devices are well known. Examples of such devices are the devices disclosed in U.S. Pat. Nos. 6,145, 901, and 5,564,888, both of which are incorporated herein by reference, as well as the prior art devices that are discussed in those patents.

Alternatively, rotary placers may be utilized to place the sections upon the labels. An example of such a device is disclosed in U.S. Pat. No. 5,153,983, the disclosure of which is incorporated herein by reference.

The integrated circuits or RFID chips may be friction fitted in recesses in the RFID microelectronic stock, or they may be secured therein by the use of adhesives and/or solder. Electrical connection between the RFID chips and circuitry to be connected to the antennas may be done with wire bonding, ribbon bonding, tape-automated bonding, lead frames, flip chip bonding, and/or conductive gluing of leads.

IV. Material Properties

RFID Webstock and RFID Sections

It is preferred that the RFID sections be sufficiently rigid so as to maintain sufficient dimensional stability and stiffness throughout the processes. Additional requirements may be imposed on the substrate material for the RFID microelectronic stock by process used to form the stock (e.g. to form reception walls); and to form conductive and dielectric materials and assorted electrical interconnect structures. Other desirable properties of the webstock are dictated by the processes for forming the inlay stock and for converting the inlay stock to label stock, such as: clean, sharp die cutting characteristics; sufficient tensile modulus to avoid undue elongation under tension (typically more than 500,000 psi); and adequate strength to avoid web breaks during operations such as matrix stripping.

When the planarization process of Alien Technologies, as discussed above, is used, a suitable polymeric film substrate is one that is dimensionally stable at 150° C. for 1 hour, micro-replicable at 260° C., exhibits good adhesion with the planarizing layer, exhibits good chemical resistance, the property of laying flat (<0.5" lift for a 11" sheet), ready removability from the tool, and die-cuttability.

In an alternative embodiment, when the planarization process of Alien Technologies is not used, a suitable polymeric film substrate is one that is micro-replicable at <260° C., the property of laying flat, ready removability from the tool, and die-cuttability.

When the fluidic self assembly process of Alien Technologies is used to form the deposit IC's in reception walls of the RFID webstock, the substrate should typically have significant chemical resistance to the FSA process, which includes exposure to DI water, non-ionic surfactants and bonding agents at about 30° C. for one hour.

A preferred substrate material is an amorphous flexible thermoplastic material suited to forming an array of precise receptor microrecesses that are formed in the substrate by a continuous embossing process. In this regard, Avery Dennison Corporation has developed substrate material and a method for embossing the substrate with wells that are temperature and dimensionally stable. This material and methods of embossing the material with wells is described in Avery Dennison's PCT international application no. PCT/US02/02647, which is incorporated by reference herein.

The substrate material will typically be inert to various industry recognized solvents, acids and bases used during planarization, masking and photoresist events. These exposures may run for periods from one minute to 30 minutes and at temperatures ranging from 30° to 100° C.

The substrate may be selected among materials, however, such as from the group consisting of high Tg polycarbonate, poly(ethylene terephthalate), polyarylate, polysulfone, polyether sulfone, poly phenyl sulfone, polyetherimide, and cyclo-olefinic copolymers. It is generally preferred that the webstock or sheetstock be constructed of a material or materials that show clean, sharp die-cutting characteristics. In this regard, a preferred substrate material is polysulfone, which exhibits favorable die-cutting characteristics and other suitable properties.

In another alternative, microembossing or a laser ablation technique can be used to create cavities in paper instead of a film. In order to have better strength and lower compressibility, liner instead of facestock paper is generally preferred. Microembossing is usually carried out using a male-female die. The resolution of paper embossing is significantly less than that of film. When supercalendered Kraft paper (SCK) is compared with polysulfone, the tensile modulus is comparable. This means that with the same web tension and the same caliper, both SCK and polysulfone will stretch to the same extent; however, elongation at break for SCK is much less. For paper, moisture sensitivity is a concern, as this would adversely affect the dimensional stability of an article according to the present invention. One preferred alternative is poly-coated paper, such as paper coated with polyethylene or polypropylene on one or both sides of the paper. This would reduce any dimensional instability as the result of exposure to moisture.

V. Antenna Web

The antenna portions may be formed on the antenna web using a wide variety of materials and processes. For example, one process involves printing on the antenna web a conductive material, such as silver conductive ink, in a pattern defining multiple antennae. The ink may be printed for example using silk screening techniques, such as in a sheet fed or roll operation. The antenna may be printed in a variety of shapes and patterns, such as a symmetrical pattern, a non-symmetrical pattern, a bow tie shaped pattern, a checkerboard shaped pattern, and/or an unequal shaped pattern, or other shapes and patterns known in the art.

The antennae are typically dried and stored on the web in a roll. However, as an alternative, the antennae may be wet printed during the converting process, and the sections applied directly to the wet printed ink. When the ink dries, the ink bonds the sections to the underlying web. The ink may optionally include a dopant to increase adhesion. A layer of pressure sensitive adhesive may be used in conjunction with the wet ink for additional stability.

Suitable methods of forming the antenna include printing conductive ink, sputtering metal, laminating foil or hot-stamping, or any method known in the art for forming an antenna on a film.

Considering the sputtered metal approach, it is noted that sputtered metal antennas may be made to be very thin while still achieving desired surface resistance or conductivity. In one preferred embodiment of a device and method according to the present invention, the antenna is formed by metallic sputter coating. Compared to conventional coating of a 60% filled silver ink, comparable surface resistance can be achieved by sputtering {fraction (1/10)} thickness of silver. Additionally, there is no drying required as in the case of a silver filled ink coating.

In one preferred embodiment in which the antenna is formed by metallic sputter coating, the sputtering occurs on a 16 in.times.6 in square target at a sputter distance of 4-5 in with a copper or aluminum target at a web speed of up to 1 ft/min and a web width of 6-10 in. Various alternatives exist for masking. In a first alternative, masking is applied on the substrate followed by removal after sputtering. In a second alternative, a pattern is masked on the web back coated with PSA which laminates to the substrate immediately before sputtering, then stripping immediately after sputtering. In a third alternative, a permanent mask is used that is very close to the substrate web (1 cm or less) so that the divergence of sputter is minimized.

The precision or definition of the printed elements of lines and spaces is critical to the performance of the antenna. With some antenna designs, conventional printing may not provide adequate resolution, line/space separation or other quality characteristics necessary to deliver engineered performance.

Likewise, control of thickness and smoothness of the printed areas of an antenna are critical to its performance. Variability due to ink formulation, environmental conditions, substrate specifications, process conditions and other factors can impact both the smoothness and final thickness of printed antennas. Surface tension effects underlie many of these variables and place constraints on the amount of ink that can be deposited, and how closely graphic elements can be positioned to one another.

Preferred substrates for the antenna web include, but are not limited to, high Tg polycarbonate, poly(ethylene terephthalate), polyarylate, polysulfone, a norbornene copolymer, poly phenylsulfone, polyetherimide, polyethylenenaphthalate (PEN), polyethersulfone (PES), polycarbonate (PC), a phenolic resin, polyester, polyimide, polyetherester, polyetheramide, cellulose acetate, aliphatic polyurethanes, polyacrylonitrile, polytrifluoroethylenes, polyvinylidene fluorides, HDPEs, poly(methyl methacrylates), or a cyclic or acyclic polyolefin. Particularly preferred substrates include polysulfone, polyester polyarylate, a norbornene copolymer, high Tg polycarbonate, and polyetherimide.

It can be desirable to utilize a material that does not unduly stretch during the manufacturing process. For example, it may be desirable to utilize a webstock having a tensile modulus of more than 500,000 psi.

Considering now exemplary dimensions, presented by way of example and not limitation, in one label embodiment, the section is approximately 7-8 mils thick, the antenna coating is about 5-10 microns (0.2-0.4 mil). The antenna may be coated on a plastic film such as Mylar, having a thickness of approximately 2-5 mil. The thickness of this particular label embodiment, including a release-coated backing sheet, is between approximately 15-20 mils. The purpose of presenting these example thickness is not to limit the thickness of any of the layers, or of the label overall. Rather, it is to illustrate that RFID labels according to the present invention may be very thin.

These various embodiments of labels incorporating IC's are just several examples of different arrangements that can be imagined for an RFID label or tag. Other arrangements are certainly possible, and are within the scope of this patent application.

VI. Additional Aspects

It should be understood that the foregoing Detailed Description describes particular embodiments to the present invention for purposes of illustration. However, the present invention is not limited to the specific examples that this Detailed Description provides. Various changes and modifications may be made to the labels or to the manufacturing process within the scope of the invention.

For example, in embodiments discussed above, sections are cut from a web, then applied to another web on which antennae are located. However, it is possible to, for example, apply a section to a web, then print or otherwise locate an antenna onto the section. This may be done by, for example, printing an antenna on the section after the section is applied to a web. Or, alternatively, sputtering metal or otherwise forming an antenna onto the section.

Considering further alternative embodiments, various additional layers may be included in the RFID labels. For instance, there may be additional layers of cushioning above or below the IC so as to cushion the component from bumps or shocks during normal use. Water-resistant layers such as one or more layers of water-resistant polymer may be included in the construction. Still other layers can be included depending on the particular properties required and the intended application of the RFID device.

Articles according to the present invention can be, for example, a luggage label or tag, a laundry label or tag, a label or tag for cataloging library articles, a label or tag for identifying an apparel product, a label or tag for identifying a postal article, a label or tag for identifying a medical article, or a label or tag for a transportation ticket. As used herein, and as recited above, the term "label" refers to an article according to the present invention that includes at an adhesive surface for attaching the article to another article according to its intended use. The term "tag" refers to an article according to the present invention that lacks an adhesive for attachment.

Layers of the label may be bonded together by means other than adhesive. For example, the integrated circuit may be held in place with a hot melt resin or other substance, which could also serve as a bonding agent. The resin could then take the place of an adhesive layer. Layers may also be bonded together by, for example, ultrasonic welding.

The adhesive surface of the label may include adhesive covering the entire bottom of the label, or may be coated in a pattern, as is known in the art. The adhesive may be of the sort that is removable so that the label may be removed from the substrate after it is applied thereto, or the adhesive may be a permanent type of adhesive for permanently bonding the label to the substrate. Alternatively, the adhesive may be repositionable, so that the label may be repositioned on the substrate after it is initially applied. The adhesive may be water-activated, heat-activated, pressure-activated, and/or activated by other means, depending on the specific application for the particular label. Alternatively, the label may have no adhesive on the underside whatsoever, as to when the label (or tag) is to be attached to the substrate by other means, which could include sewing, welding, heat bonding, mechanical fastening or any other affixing method known in the tag or label art.

Another alternative is to provide a label or tag having more than one RFID chip. For example, the receptor film may have multiple recesses per section, with one RFID chip per recess. The RFID chips may be arranged in a row, column or matrix, and may be electrically interconnected with one another.

As another alternative, a label or tag may include electrical and/or electronic components other than RFID chips. For instance, an RFID label or tag may include a sensor, a MEMS, or other type of component. The components may be electrically interconnected to form a circuit. The type of electrical and/or electronic components to be used can be selected by one of ordinary skill in the art and depends on the use of the label or tag.

It is again noted that the RFID chip does not necessarily need to be positioned in a well as described in FIG. 2, for example. The RFID chip could be atop the substrate, rather than in a well, or could be otherwise incorporated into or onto the substrate. For example, the RFID IC could be a "flip chip" type, wherein the die is made so that exposed contacts, or pads on the die have bumps on them. In normal flip chip packaging, the die is flipped over and contacted directly into the leads that provide electrical contacts for a circuit including the IC. RFID tag and label constructions using "flip chip" technology are available for example from KSW Microtec GmbH, Dresden Germany.

As another example of IC packaging technologies compatible with the present invention, the manufacturing method of the invention may be used with "lead frame" webs. In this embodiment, the IC would be mounted to a web with a conductive metal network which may have relatively large area portions, commonly called pads or flags, for direct contact with semiconductor chips or dice, and lead elements for facilitating electrical interconnection of the chips or dies via intermediate (e.g., jumper) connections to the antenna.

Consequently, it should be understood that the Detailed Description does not describe all of the various changes that might be made to the specific examples given in this Detailed Description.

What is claimed is:

1. A method of forming RFID articles, the method comprising:
    separating an RFID microelectronic stock into a plurality of sections, wherein the RFID microelectronic stock includes a plurality of electrical connectors, each electrically coupled to one of a plurality of RFID chips, wherein each of the sections includes one or more of the electrical connectors and one or more of the RFID chips;
    securing the separated sections to a transport member;
    transferring the sections on the transport member to an antenna web, wherein the antenna web includes a plurality of spaced antennas disposed thereon; and
    attaching the sections to the antenna web such that the sections are operatively coupled to respective of the antennas;
    wherein the attaching and at least part of the transferring occurs while the antenna web is moving; and
    wherein the separating occurs while the RFID microelectronic stock is moving;
    further comprising periodic forward and retrograde motions of the RFID microelectronic stock.

2. The method of claim 1, wherein the transferring includes moving the transport member such that the transport member has substantially the same speed as the antenna web when the sections are transferred from the transport member to the antenna web.

3. The method of claim 1, wherein the RFID microelectronic stock is an RFID sheetstock.

4. The method of claim 1, wherein the RFID microelectronic stock is an RFID webstock.

5. The method of claim 1, wherein the RFID microelectronic stock is a flexible RFID microelectronic stock.

6. The method of claim 1,
    wherein the transport member includes a roller; and
    wherein the securing includes securing the sections to the roller.

7. The method of claim 1,
    wherein the transport member includes a pick and place device; and
    wherein the securing includes securing the sections to the pick and place device.

8. The method of claim 1, wherein the separating includes cutting the RFID microelectronic stock.

9. The method of claim 8, wherein the transport member acts as an anvil during the cutting.

10. The method of claim 9,
    wherein the transport member includes a roller; and
    wherein the securing includes securing the sections to the roller.

11. The method of claim 1, wherein the attaching includes applying pressure to form a durable bond between the electrical connectors and the antennas.

12. The method of claim 1, wherein the attaching includes crimping metal surfaces of the sections and the antennas.

13. A method of forming RFID articles, the method comprising:
    transporting an RFID microelectronic stock;
    separating the RFID microelectronic stock into a plurality of sections, wherein the RFID microelectronic stock includes a plurality of electrical connectors, each electrically coupled to one of a plurality of RFID chips, wherein each of the sections includes one or more of the electrical connectors and one or more of the RFID chips;
    securing the separated sections to a transport member;
    transferring the sections on the transport member to an antenna web, wherein the antenna web includes a plurality of spaced antennas disposed thereon; and
    attaching the sections to the antenna web such that the sections are operatively coupled to respective of the antennas;
    wherein the transporting, the separating, and the securing change pitch of the RFID chips from a first pitch to a second pitch; and
    wherein the transporting includes periodic forward and retrograde motions of the RFID microelectronic stock.

14. The method of claim 13, wherein the separating occurs while the RFID microelectronic stock is moving.

15. The method of claim 13, wherein the attaching and at least part of the transferring occurs while the antenna web is moving.

16. The method of claim 13, wherein the RFID microelectronic stock is an RFID sheetstock.

17. The method of claim 13, wherein the RFID microelectronic stock is an RFID webstock.

18. The method of claim 13, wherein the RFID microelectronic stock is a flexible RFID microelectronic stock.

19. The method of claim 13,
    wherein the transport member includes a roller; and
    wherein the securing includes securing the sections to the roller.

20. The method of claim 13,
    wherein the transport member includes a pick and place device; and
    wherein the securing includes securing the sections to the pick and place device.

21. The method of claim 13, wherein the separating includes cutting the RFID microelectronic stock.

22. The method of claim 21, wherein the transport member acts as an anvil during the cutting.

23. The method of claim 13,
    wherein the transport member includes a roller; and
    wherein the securing includes securing the sections to the roller.

24. The method of claim 13, wherein the separating and the securing occur substantially simultaneously for each of the sections.

25. The method of claim 13, wherein the attaching includes applying pressure to form a durable bond between the electrical connectors and the antennas.

26. The method of claim 13, wherein the attaching includes crimping metal surfaces of the sections and the antennas.

* * * * *